United States Patent
Kawase et al.

(10) Patent No.: US 7,180,108 B2
(45) Date of Patent: Feb. 20, 2007

(54) TRANSISTOR, CIRCUIT BOARD, DISPLAY AND ELECTRONIC EQUIPMENT

(75) Inventors: Takeo Kawase, Suwa (JP); Soichi Moriya, Suwa (JP); Mitsuaki Harada, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 3 days.

(21) Appl. No.: 11/049,974

(22) Filed: Feb. 4, 2005

(65) Prior Publication Data
US 2005/0173701 A1 Aug. 11, 2005

(30) Foreign Application Priority Data
Feb. 9, 2004 (JP) ............... 2004-032572

(51) Int. Cl.
*H01L 29/76* (2006.01)
(52) U.S. Cl. ............... 257/288; 257/40; 257/72; 257/258
(58) Field of Classification Search ........... 257/40, 257/72, 258, E33.018, E31.013, E23.112, 257/E21.151, 288
See application file for complete search history.

(56) References Cited

U.S. PATENT DOCUMENTS

| | | |
|---|---|---|
| 5,574,291 A | 11/1996 | Dodabalpur et al. |
| 6,150,191 A | 11/2000 | Bao |
| 6,885,146 B2 | 4/2005 | Yamazaki et al. |
| 2003/0076649 A1* | 4/2003 | Speakman .......... 361/524 |

FOREIGN PATENT DOCUMENTS

| | | |
|---|---|---|
| KR | 2003-0074472 | 3/2003 |
| WO | WO 01/047043 A1 | 6/2001 |
| WO | WO 01/047045 A1 | 6/2001 |

OTHER PUBLICATIONS

Qiu et al., "$H_2O$ effect on the stability of organic thin-film field-effect transistors," Applied Physics Letters, vol. 83, No. 8, pp. 1644-1646, Aug. 25, 2003.

* cited by examiner

*Primary Examiner*—Leonardo Andujar
*Assistant Examiner*—Tan Tran
(74) *Attorney, Agent, or Firm*—Oliff & Berridge, PLC

(57) ABSTRACT

A transistor having at least one of a source electrode and a drain electrode being formed of a porous film is described. The transistor maintains its characteristics even after being subjected to a high temperature and high humidity environment. The transistor may be used in a circuit board, a display and electronic equipment.

13 Claims, 7 Drawing Sheets

TRANSISTOR, CIRCUIT BOARD, DISPLAY AND ELECTRONIC EQUIPMENT

RELATED APPLICATION INFORMATION

This application claims priority to Japanese Application No. 2004-32572, filed Feb. 9, 2004, whose contents are expressly incorporated herein by reference.

FIELD OF THE INVENTION

Aspects of the present invention relate to a transistor, a circuit board, a display, and electronic equipment.

BACKGROUND

The development of transistors employing organic materials (for instance, organic semiconductor materials) that exhibit semi-conducting electrical conductivity has recently progressed. These transistors have advantages such as being thinner, lighter, having lower material costs, and so forth, supporting their use as a switching element of a flexible display and so forth. Transistors have been proposed in which a source electrode and a drain electrode are formed on a substrate while an organic semiconductor layer, a gate insulating layer and a gate electrode are deposited above these electrodes in that order. These transistors can be fabricated in the atmosphere by using vapor deposition or a coating method.

However, the fact that these transistors can be fabricated in an atmosphere does not necessarily lead to the stable operation thereof in the atmosphere. Specifically, in the atmosphere, the organic semiconductor layer is doped with oxygen and water, which increases an off-state current, or in contrast increases traps so as to cause the deterioration of subthreshold swing (S value) and threshold voltage (Vth). A method of encapsulating a transistor has been proposed as a method of preventing an organic semiconductor layer from being doped with oxygen and water in the atmosphere.

Specifically, a transistor is fabricated on a glass substrate and then an encapsulating film is deposited in vacuum so as to cover the transistor, thereby encapsulating it. This prevents the organic semiconductor layer from being doped with oxygen and water, and thus the characteristics of the transistor can be stabilized. Also, a method has been proposed in which a multilayer of inorganic films and polymer films alternately deposited is used as an encapsulating film for further enhancing the encapsulating characteristic.

However, the methods of encapsulating a transistor result in an increased cost for the transistor because vacuum treatment and heat treatment are required. In addition, in the case of using a plastic substrate as a substrate, a gas barrier film also needs to be formed on the plastic substrate side because of the low gas-barrier characteristic of plastic materials, thereby further increasing costs.

Also, if a non-flexible component material (for example, silicon oxide or silicon nitride) is used as an encapsulating film, the flexibility of a transistor may be reduced. Even if these films are sufficiently thin, cracks tend to be generated in the films when a substrate is bent, or temperature or humidity varies. It, therefore, is difficult to achieve high reliability. Accordingly, a technique in which a gate electrode is composed of a metal film formed by vapor deposition has been proposed, for example, as a method of encapsulating a transistor at lower costs. Since a metal film formed by vapor deposition is a dense film and therefore exhibits a comparatively high barrier characteristic against water and oxygen, forming the metal film as a gate electrode to cover a channel part enables the metal film to function as an encapsulating material.

However, although the transistor thus fabricated exerts a comparatively high encapsulating characteristic, it is impossible to obtain a complete encapsulating. Therefore, if a transistor is subjected to a high temperature and high humidity environment and oxygen and water enter the inside thereof once, the high encapsulating characteristic functions adversely. That is, even when the transistor is brought back to a low temperature and low humidity environment, the oxygen and water are not discharged outside the transistor but remain in the inside thereof for a long time. Oxygen and water trapped therein deteriorate the characteristics of the transistor.

The following is a list of relevant documents related to the application: U.S. Pat. No. 6,150,191, U.S. Pat. No. 5,574,291, International Patent Publication No. 0147043, International Patent Publication No. 0147045, and Yong Qiu et al. (five coauthors), "H20 effect on the stability of organic thin-film field-effect transistors", APPLIED PHYSICS LETTERS, Unites States, American Institute of Physics, 2003 Aug. 25, Vol. 83, No. 8, p. 1644–1646.

SUMMARY

Aspects of the present invention provide a transistor that can maintain its high characteristics even after being subjected to a high temperature and high humidity environment. Aspects of the invention also relate to a circuit board, a display and electronic equipment that may include the transistor.

BRIEF DESCRIPTION OF THE DRAWINGS

FIG. 1A is a longitudinal sectional view, and FIG. 1B is a plan view.

DESCRIPTION OF PREFERRED EMBODIMENTS

Figure 1A:
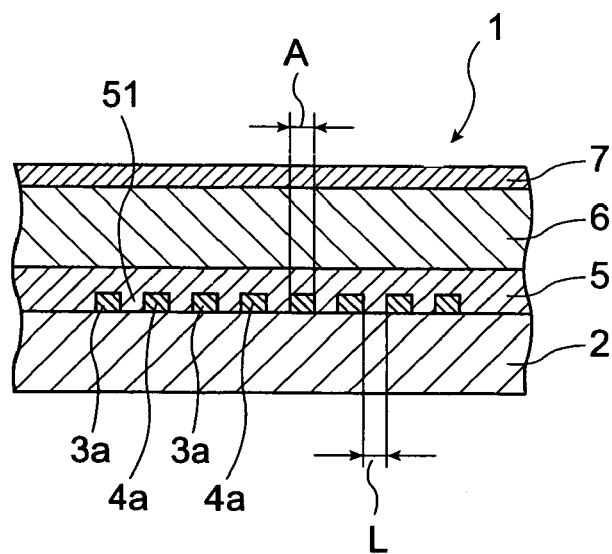
FIGS. 1A and 1B are diagrams showing a thin film transistor of aspects of the present invention, where

The following description is divided into sections to assist the reader.

Overview

A transistor of at least one aspect of the present invention may comprise: a source electrode and a drain electrode; an organic semiconductor layer provided in contact with the source electrode and the drain electrode; a gate insulating layer provided in contact with the organic semiconductor layer; and a gate electrode insulated from the source electrode and the drain electrode by intermediary of the gate insulating layer, wherein at least one of the gate electrode, the source electrode and the drain electrode is composed of a porous film composed mainly of an electrically conductive material. With this structure, the transistor can maintain its high characteristics even after being subjected to an environment having high temperature and high humidity.

In the transistor of aspects of the present invention, the transistor may or may not have a top gate structure and the gate electrode including a porous film. With this structure, the transistor can maintain its high characteristics even after being subjected to a high temperature and high humidity environment.

In the transistor of aspects of the present invention, porosity of the porous film may range from 20% to 85%. This porosity can more surely discharge oxygen and water that have entered inside, and can adequately prevent a decrease in conductivity of the porous film.

In the transistor of aspects of the present invention, the porous film may or may not have a carbon atom or a carbon compound in a pore of the porous film. This enables the inner surfaces of the pores to be endowed with hydrophobicity, and therefore can prevent dew condensation (accumulation) from being generated when water or the like passes through the pores. Thus the transformation and deterioration of the porous film can adequately be prevented.

In the transistor of aspects of the present invention, the porous film may or may not be formed by using a liquid material including an electrically conductive particle. This may facilitate the formation of a porous film having an intended porosity.

In the transistor of aspects of the present invention, the conductive particle may or may not comprise as a main component at least one of gold, silver, copper, platinum, palladium, nickel, and an alloy including these elements. These substances are preferable because of high electrical conductivity.

In the transistor of aspects of the present invention, the liquid material may or may not comprise the conductive particle and a dispersion medium including water. In the transistor of the present invention, the porous film may or may not be formed by using a coating method. Thus, the porous film can be formed more easily.

In the transistor of aspects of the present invention, the coating method may or may not include an ink jet method. The ink jet method permits the formation of a porous film with high dimensional accuracy. In the transistor of aspects of the present invention, the porous film may be obtained through a heating process. This heating process can easily and surely remove substances that may be included in the liquid material and should be removed.

In the transistor of aspects of the present invention, heating temperature in the heating process may be equal to or smaller than 200 degrees centigrade. This can prevent the lowering of the porosity.

In the transistor of aspects of the present invention, the conductive material may or may not include a metal material and/or a metal oxide material as a main component. Thus, the porous film having high conductivity may be formed.

In the transistor of aspects of the present invention, the organic semiconductor layer may include a polymer including arylamine or a derivative of the polymer. The organic semiconductor layer composed of such an organic semiconductor material may have high water-resistance and oxidation-resistance characteristics. Therefore, in this example, the organic semiconductor layer is chemically stable particularly and the quality deterioration thereof is avoided even when it is temporarily subjected to a high temperature and high humidity environment.

In the transistor of aspects of the present invention, the organic semiconductor layer may be composed mainly of a copolymer including fluorene and bithiophene, or a derivative of the copolymer.

The organic semiconductor layer composed of such an organic semiconductor material may exhibit high water-resistance and oxidation-resistance characteristics. Accordingly, the organic semiconductor layer is chemically stable and deterioration of the quality of the layer is avoided even when a transistor is temporarily subjected to a high temperature and high humidity environment.

In the transistor of aspects of the present invention, the organic semiconductor layer may be formed by using an ink jet method. With the ink jet method, the organic semiconductor layer having an intended shape can be formed with high dimensional accuracy.

In the transistor of aspects of the present invention, both of the source electrode and the drain electrode may be formed in a comb teeth shape and in such a manner that the teeth interdigitate with each other. This form can prevent the increase of the area of an overlapping part between the gate electrode and the source and drain electrodes, and thus the characteristics of the transistor can further be enhanced.

A circuit board of aspects of the present invention comprises a plurality of the transistors of the present invention. This can provide a highly reliable circuit board. In the circuit board of the present invention, at least a part of the gate electrode provided for the transistors is composed of a common electrode. This structure facilitates the formation of a gate electrode, reducing the manufacturing time of the circuit board. In the circuit board of the present invention, the common electrode is preferably almost linear.

A display of the present invention comprises: the circuit board of the present invention; pixel electrodes connected to each of the transistors; a counter electrode provided so as to face the pixel electrodes; and a display medium interposed between the counter electrode and the pixel electrodes. This structure allows the provision of a highly reliable display.

The display of aspects of the present invention may further comprise a protective film provided closer to the circuit board than the display medium so as to cover the transistors and the pixel electrodes. For example, this structure can adequately prevent shear stress from being placed on the transistor, the display medium, and so forth. In the display of the present invention, the display medium may or may not comprise an organophilic liquid that dissolves or swells a material forming the organic semiconductor layer.

In the display of aspects of the present invention, the protective film may or may not have a function to prevent the organophilic liquid from diffusing toward the circuit board. This can avoid the dissolution and swelling of the organic semiconductor layer, and therefore can adequately prevent the deterioration of characteristics of the transistor. In the display of aspects of the present invention, the protective film may be formed mainly of a hydrophilic polymer material. According to this, even if the organophilic liquid flows out from the display medium, the organophilic liquid can be prevented from passing through the protective film so as to enter the circuit board.

In the display of the present invention, the polymer material may include as a main component a polymer including vinyl alcohol. These substances have particularly high hydrophilicity. Therefore, even if the organophilic liquid flows out from the display medium, the organophilic liquid can be prevented from passing through the protective film so as to enter the circuit board particularly effectively. Electronic equipment of aspects of the present invention may include a display in accordance with aspects of the present invention. Thus, the electronic equipment with high reliability can be obtained.

Thin Film Transistor

First, the structure of a thin film transistor of the present invention is described.

Figure 1B:
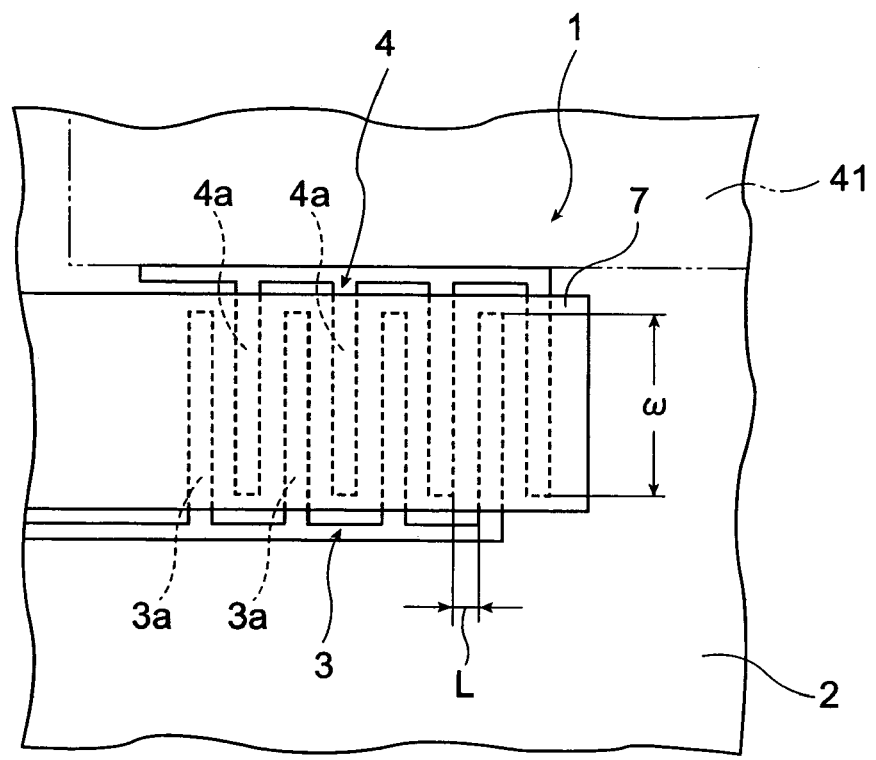

FIGS. 1A and 1B are diagrams showing a thin film transistor having a first structure. FIG. 1A is a longitudinal sectional view, and FIG. 1B is a plan view. In the following description, the upper side in FIG. 1A corresponds to the upper side of the thin film transistor, while the lower side corresponds to the lower side thereof. A thin film transistor 1 shown in FIGS. 1A and 1B is provided on a substrate 2, and comprises a source electrode 3 (source electrode fingers 3a) and a drain electrode 4 (drain electrode fingers 4a), an organic semiconductor layer (organic layer) 5, a gate insulating layer 6, and a gate electrode 7 that are deposited in that order from the substrate 2 side.

Specifically, in the thin film transistor 1, both the source electrode 3 and drain electrode 4 are formed on the substrate 2 in comb teeth and in such a manner that the teeth interdigitate with each other. The interdigitation may occur on a one-to-one basis or other interval (two-to-two, one-to-two, etc.). The organic semiconductor layer 5 is provided so as to cover and be in contact with the electrodes 3 and 4. The gate insulating layer 6 is provided on and in contact with the organic semiconductor layer 5. On the gate insulating layer 6, the gate electrode 7 is provided so as to overlap, with the intermediary of the gate insulating layer 6, a region in which the teeth of the source and drain electrodes 3 and 4 interdigitate with each other.

More specifically, the source electrode 3 and the drain electrode 4 have a plurality of electrode fingers 3a and 4a arranged at certain intervals, respectively, so as to have a comb teeth shape as a whole. Furthermore, the source and drain electrodes 3 and 4 are provided in such a manner that the electrode fingers 3a and 4a are alternately arranged (in varying degrees as described above).

Such a thin film transistor 1 has a structure in which the source and drain electrodes 3 and 4 are provided closer to the substrate 2 than the gate electrode 7, with the gate insulating layer 6 being between the electrodes 3 and 4, and the gate electrode 7. That is, the thin film transistor 1 has a top gate structure.

Each element making up the thin film transistor 1 will be described below sequentially.

The substrate 2 supports each layer (each element) of the thin-film transistor 1. The following substrates can be used as the substrate 2, for example: a glass substrate; a plastic substrate (resin substrate) composed of polyimide, polyethylene terephthalate (PET), polyethylene naphthalate (PEN), polymethylmethacrylate (PMMA), polycarbonate (PC), polyethersulphone (PES), aromatic polyester (liquid crystal polymer), or the like; a quartz substrate; a silicon substrate; and a gallium arsenide substrate. In the case of endowing the thin film transistor 1 with flexibility, a plastic substrate is selected as the substrate 2.

A underlying layer may be provided on the substrate 2. The underlying layer is provided, for example, with a view to preventing the diffusion of ions from the surface of the substrate 2, or to improving the adhesiveness (bonding characteristic) between the source and drain electrodes 3 and 4 and the substrate 2. As a component material of a underlying layer, although there is no limitation, silicon dioxide (SiO2), silicon nitride (SiN), polyimide, polyamide, a polymer that is cross-linked so as to be insolubilized, or the like may be used.

The electrode fingers 3a and 4a of the source and drain electrodes 3 and 4 are provided on the substrate 2 along the channel length L direction in such a manner to be arranged alternately at certain intervals.

In the thin film transistor 1, out of the organic semiconductor layer 5, regions between the electrode fingers 3a of the source electrode 3 and the electrode fingers 4a of the drain electrode 4 are channel regions 51 in which carriers move. Also, the length of movement direction of carriers in regions between the electrode fingers 3a of the source electrode 3 and the electrode fingers 4a of the drain electrode 4, that is, the distance between each of the electrode fingers 3a and 4a corresponds to the channel length L. The product of the length ω of the direction perpendicular to the channel length L direction and the number of intervals (gaps) N between the electrode fingers 3a and 4a is the channel width W.

In the thin film transistor 1 in which the source and drain electrodes 3 and 4 are formed in comb teeth and regions between the electrode fingers 3a and 4a are channel regions, the width A of the electrode fingers 3a and 4a determines the area of overlapping portions between the source and drain electrodes 3 and 4, and the gate electrode 7.

Furthermore, in the present embodiment, the source and drain electrodes 3 and 4 may be formed using a resist layer formed by photolithography as a mask, as described later. The width A of the electrode fingers 3a and 4a depends on the accuracy of photolithography. However, the narrowing of the electrode fingers is possible since the accuracy of photolithography is high.

Thus, even if the gate electrode 7 is formed by an ink jet method as described later and therefore has a comparatively large width, the area of overlapping portions between the gate electrode 7 and the source and drain electrodes 3 and 4 can be prevented from increasing. According to this, the capacitance of the gate can be reduced in the thin film transistor 1. As a result, good characteristics (for instance, a switching characteristic) may be exhibited.

As above, since there is no need to form the gate electrode 7 in a minute shape in the present embodiment, the range of options in a forming method thereof is widened. Thus, the thin film transistor 1 having a good characteristic is obtained even if various coating methods (including but not limited to the ink jet method) are used for forming the gate electrode 7.

A component material of these source and drain electrodes 3 and 4 is not particularly limited as long as it has electrical conductively. For example, one or a combination of two or more of the following substances can be used as the material: conductive materials such as Pd, Pt, Au, W, Ta, Mo, Al, Cr, Ti, Cu, and an alloy including these elements; conductive oxides such as ITO, FTO, ATO and SnO2; carbon materials such as a carbon black, a carbon nanotube and a fullerene; and conductive polymer materials such as a polyacetylene, a polypyrrole, a polythiophene like a polyethylenedioxythiophene (PEDOT), a polyaniline, a poly(p-phenylene), a polyfluorene, a polycarbazole, a polysilane, and a derivative of these substances. The conductive polymer material is typically used after being doped with a high molecular weight material of an iron oxide, iodine, an inorganic acid, an organic acid, or a polystyrene sulfonic acid so as to be endowed with electrical conductivity. Of the above substances, a material composed mainly of Ni, Cu, Co, Au, Pd, or an alloy including these elements is may, in some examples of the invention, be used as a component material of the source and drain electrodes 3 and 4. In the case of forming the source and drain electrodes 3 and 4 by using these metal materials, the electrodes 3 and 4 of high deposition accuracy can be formed at low costs by using electroless plating in a forming process of the electrodes 3 and 4 to be described later, enabling the fabrication of the thin film transistor 1 having high characteristics (for example, switching characteristics).

The thickness (in average) of the source and drain electrodes 3 and 4 may be, but not limited to, about 30–300 nm, and is more preferably about 50–150 nm.

The width A of the electrode fingers 3*a* and 4*a* is preferably 20 μm or less, and is more preferably 10 μm or less, although greater widths A may be used.

Also, the distance (separation distance) between the source electrode finger 3*a* and the drain electrode finger 4*a*, that is, the channel length L is preferably about 2–20 μm, and is more preferably about 3–10 μm, although other channel lengths may be used. The smaller channel length L permits the control of a larger drain current, and enables the capacitance of the gate electrode to be reduced. However, if the channel length L is smaller than the above lower limit, a highly accurate photolithography techniques may be required for patterning the electrodes, causing a rise in associated manufacturing costs. In addition, even if the small channel length L is achieved, expected effects are not always obtained because of the contact resistance between the source electrode and the organic semiconductor layer in many cases. In contrast, if the channel length L is larger than the above upper limit, a drain current may be made small and, therefore, the characteristics of the thin film transistor 1 may be insufficient.

The channel width W is preferably about 0.1–5 mm, and is more preferably about 0.3–3 mm. If the channel width W is smaller than the above lower limit, a drain current becomes small and therefore the characteristics of the thin film transistor 1 may be insufficient. In contrast, the channel width W is larger than the above upper limit, the size of the thin film transistor 1 increases while the increase of the parasitic capacitance and the increase of a leak current to the gate electrode 7 through the gate insulating layer 6 may be caused.

The organic semiconductor layer 5 is provided on and in contact with the substrate 2 so as to cover the source and drain electrodes 3 and 4.

The organic semiconductor layer 5 is composed mainly of an organic semiconductor material (organic material exhibiting semiconducting electrical conductivity).

The organic semiconductor layer 5 is preferably oriented so as to be almost parallel with the channel length L direction at least in channel regions 51. This enhances the carrier mobility in the channel regions 51, with the result that the operation speed of the thin film transistor 1 is further enhanced.

For example, examples of an organic semiconductor material include low molecular weight organic semiconductor materials such as a naphthalene, anthracene, tetracene, pentacene, hexacene, phtalocyanine, perylene, hydrazone, triphenylmethane, diphenylmethane, stilbene, aryl vinyl, pyrazoline, triphenylamine, triarylamine, oligothiophene, and derivative of these substances. Also, examples of an organic semiconductor material include polymer organic semiconductor materials (conjugated polymer material) such as a poly(N-vinylcarbazole), polyvinylpyrene, polyvinylanthracene, polythiophene, polyhexylthiophene, poly(p-phenylenevinylene), polythienylenevinylene, polyarylamine, pyrene formaldehyde resin, ethylcarbazole formaldehyde resin, fluorene-bithiophene copolymer, fluorene-arylamine copolymer, and derivative of these substances. One or a combination of two or more of the above substances can be used. Particularly, it is preferable to use a material composed mainly of a polymer organic semiconductor material (conjugated polymer material). In a conjugated polymer material, the mobility of carriers is particularly high because of the particular distribution of electron clouds therein. Such a polymer organic semiconductor material can be deposited with a simple method and can be oriented comparatively easily.

Of these materials, an organic semiconductor material is may be composed mainly of at least one of a copolymer including a fluorene and bithiophene such as a fluorene-bithiophene copolymer, a polymer including an arylamine such as a polyarylamine or fluorine-arylamine copolymer, and a derivative of these substances. An organic semiconductor material is more preferably composed mainly of at least one of a polyarylamine, a fluorene-bithiophene copolymer, and a derivative of these substances. The organic semiconductor layer 5 composed of such an organic semiconductor material has high water-resistance and oxidation-resistance characteristics. Therefore, the organic semiconductor layer 5 is chemically stable and the quality deterioration thereof is avoided, even when it is temporarily subjected to a high temperature and high humidity environment.

The organic semiconductor layer 5 including a polymer organic semiconductor material as a main material can be formed in a thinned and lightened manner, and is superior in flexibility. Therefore, it is suitably applied to a thin film transistor used as a switching element of a flexible display and so forth.

The thickness (in average) of the organic semiconductor layer 5 is preferably about 0.1–1000 nm, and is more preferably about 1–500 nm. Also, the thickness is further preferably about 10–100 nm.

The organic semiconductor layer 5 need not necessarily cover the source and drain electrodes 3 and 4. It is sufficient that the organic semiconductor layer 5 is provided at least on the regions (channel regions 51) between the source and drain electrodes 3 and 4.

The gate insulating layer 6 is provided on and in contact with the organic semiconductor layer 5. The gate insulating layer 6 insulates the gate electrode 7 from the source and drain electrodes 3 and 4.

The gate insulating layer 6 is preferably composed mainly of an organic material (particularly organic polymer material). The gate insulating layer 6, composed mainly of an organic polymer material, is easy to form and can achieve higher adhesiveness with the organic semiconductor layer 5.

For example, examples of such an organic polymer material include: acrylic resin such as polystyrene, polyimide, polyamideimide, polyvinylphenylene, polycarbonate (PC) and polymethylmethacrylate (PMMA); fluorine resin such as polytetrafluoroethylene (PTFE); phenol resin such as polyvinylphenol and novolac resin; and olefin resin such as polyethylene, polypropylene, polyisobutylene and polybutene. One or a combination of two or more of these materials can be used.

The thickness (in average) of the gate insulating layer 6 is preferably, but not limited to, about 10–5000 nm, and is more preferably 100–1000 nm. If the thickness of the gate insulating layer 6 is in the above range, the source and drain electrodes 3 and 4 are surely insulated from the gate electrode 7, while the size of the thin film transistor 1 (the thickness thereof particularly) can be prevented from increasing. The gate insulating layer 6 is not limited to a single layer but may have a multi-layered structure.

Also, an inorganic insulating material such as SiO2 may be used as a component material of the gate insulating layer 6, for example. In this case, a solution of polysilicate, polysiloxane or polysilazane is applied and then the coating film is heated in the presence of oxygen or water vapor, whereby SiO2 can be obtained as the gate insulating layer 6 from the solution material. Alternately, a metal alkoxide solution is applied and then is heated in an oxygen atmosphere, whereby an inorganic insulating material can be obtained (this method is known as a sol-gel method).

Gate electrode 7 may be provided aAbove the gate insulating layer 6 where it is insulated from the source and drain electrodes 3 and 4 by the intermediary of the gate insulating layer 6.

In at least one embodiment, the gate electrode 7 may be composed of a porous film composed mainly of a conductive material.

If the gate electrode is composed of a metal film formed by vapor deposition, although such a gate electrode exhibits a comparatively high encapsulating characteristic as described above, it is impossible to achieve a complete encapsulating characteristic. In such a thin film transistor, therefore, if oxygen and water once enters the inside thereof, the oxygen and water are not discharged outside the thin film transistor but remain therein for a long time. Such a thin film transistor then exhibits a problem in that oxygen and water, accumulated therein, deteriorates the characteristics of the transistor.

In contrast, in at least some aspects of the present invention, at least one of a source electrode, drain electrode and gate electrode (the gate electrode 7 in the present embodiment) may be composed of a porous film composed mainly of a conductive material, whereby the gate electrode 7 has high air permeability. As a result, even if the thin film transistor 1 is subjected to a high temperature and high humidity environment temporarily, the oxygen and water that have entered the inside thereof are rapidly discharged outside the thin film transistor 1 when the thin film transistor 1 is brought back to a low temperature and low humidity environment. Thus, since oxygen and water are prevented from being accumulated in the inside of the thin film transistor 1 of the present invention, the characteristics of the thin film transistor 1 are adequately maintained.

The porosity of the porous film is preferably, but not limited to, about 20–85%, and is more preferably about 40–85%. Also, it is further preferably about 60–75%. According to this, oxygen and water that have entered the thin film transistor 1 are more readily discharged therefrom. If the porosity is beyond the above upper limit, the electrical conductivity of the porous film may be extremely lowered depending on the kind or the like of the conductive material.

For example, examples of a conductive material (metal material or metal oxide material) constituting a porous film include: Ag, Pd, Pt, Au, W, Ta, Mo, Al, Cr, Ti, Cu, Ni, an alloy including these elements, indium tin oxide (ITO), indium oxide (IO), indium zinc oxide (IZO), antimony tin oxide (ATO), and tin dioxide (SnO2). One or a combination of two or more of these substances can be used. In addition to these substances, for example, such a conductive polymer material as referenced above as a material for the source and drain electrodes 3 and 4 may be used as a conductive material.

Of these substances, at least one of Au, Ag, Cu, Pt, Pd, Ni, and an alloy including these elements is preferably used as a main component. These substances are preferable because of high electrical conductivity. The thickness (in average) of the porous film (gate electrode 7) is preferably, but not limited to, about 0.1–5000 nm, and is more preferably about 1–5000 nm. Also, the thickness may further preferably range between 10–5000 nm.

Although other substances may not exist in the pores of the porous film substantially, it is preferable that carbon atoms or carbon compounds exist therein. This enables the inner surfaces of the pores to be endowed with hydrophobicity, and therefore the generation of dew condensation (accumulation) when water or the like passes through the pores can be avoided. As a result, the transformation and deterioration of a porous film can be adequately prevented.

For example, graphite, hydrogen carbon, etc. carbon compounds. These carbon compounds may arise (be generated) in a forming process of a first line 91 (gate electrode 7) to be described later, or may be provided in pores after a porous film is formed, for example.

In the thin film transistor 1 as above, the amount of a current flowing between the source and drain electrodes 3 and 4 is controlled by changing a voltage applied to the gate electrode 7.

Specifically, in an OFF state in which a voltage is not applied to the gate electrode 7, even if a voltage is applied between the source electrode 3 (source electrode fingers 3a) and the drain electrode 4 (drain electrode fingers 4a), no more than a minute current flows since few carriers exist in the organic semiconductor layer 5. Meanwhile, in an ON state in which a voltage is applied to the gate electrode 7, movable charges (carriers) are induced in a portion of the organic semiconductor layer 5 that faces the gate insulating layer 6, and thus a path of carriers is formed in the channel region 51. When a voltage is applied between the source and drain electrodes 3 and 4 in this state, a current flows through the channel region 51.

In the various embodiments, a structure has been described in which both of the source and drain electrodes 3 and 4 are formed in comb teeth and the teeth interdigitate with each other. However, the shape of these electrodes 3 and 4 are not limited thereto. For example, both of the electrodes 3 and 4 may be formed in a substantially rectangle and may be juxtaposed to each other at a certain interval.

Also, in the various embodiments, thin film transistor 1 having the gate electrode 7 may be composed of a porous film. However, at least one of a source electrode, drain electrode and gate electrode may be composed of a porous film.

Furthermore, the thin film transistor of aspects of the present invention may also be applied to, besides a top gate structure, a bottom gate structure thin film transistor.

(Circuit Board)

Figure 2:
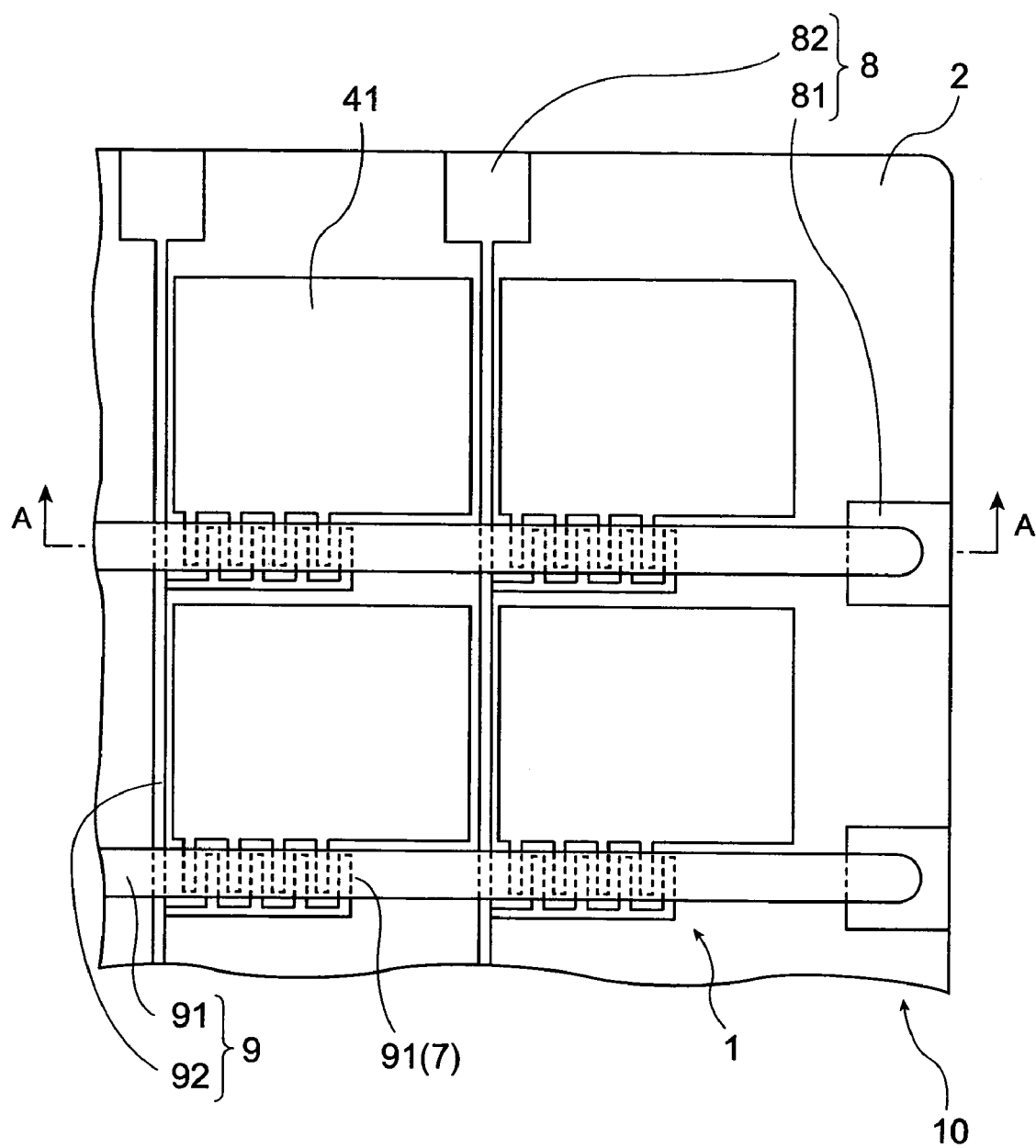
FIG. 2 is a plan view showing an embodiment of a circuit board of aspects of the present invention.

One example of the structure of a circuit board including a plurality of the above-described thin film transistors 1 will now be described. FIG. 2 is a plan view showing an embodiment of a flexible circuit board of aspects of the present invention. In the following description, the near side of FIG. 2 corresponds to the upper side of the circuit board, while the back side corresponds to the lower side thereof. A circuit board 10 shown in FIG. 2 comprises the substrate 2, pixel electrodes 41, the thin film transistors 1, connection terminals 8 and lines 9. Each of the elements 41, 1, 8 and 9 is provided on the substrate 2.

The substrate 2 is a support body for supporting each of the elements 41, 1, 8 and 9 provided thereon. The pixel electrodes 41 constitute electrodes of one side that apply a voltage for driving each pixel when an electrophoretic display 20 to be described later is built by using the circuit board 10. The pixel electrodes 41 are arranged in a matrix.

Each pixel electrode 41 is connected to the drain electrode 4 included in each of the thin film transistors 1 that are arranged in a matrix. Therefore, controlling the operation of the thin film transistors 1 enables the driving of each pixel to be controlled in the electrophoretic display 20 to be described later. The connection terminals 8 comprise a plurality of first terminals 81 and a plurality of second terminals 82.

Each of the first terminals 81 and each of the second terminals 82 constitute a terminal to be connected to a driving IC.

Also, the lines 9 are constituted by a plurality of first lines 91 and a plurality of second lines 92 provided relatively perpendicularly to the lines 91.

In the present embodiment, the gate electrode 7 for the thin film transistors 1 arranged in one row is a common electrode although separate electrodes may be used as well. This common electrode constitutes the first line 91. Thus the first lines 91 are substantially straight. One end of each of the first lines 91 is connected to one of the first terminals 81.

Such a configuration of the first lines 91 enables the gate electrodes 7 of a certain number (as many as needed) to be formed at the same time. As a result, the manufacturing time for the circuit board 10 can be shortened.

Also, one end of each of the second lines 92 may be connected to one of the second terminals 82. The source electrodes 3 of a plurality of the thin film transistors 1 are connected to halfway points of the second lines 92.

Any substance can be used as a component material of the pixel electrodes 41, the connection terminals 8 (first terminals 81 and second terminals 82) and the second lines 92 as long as the substance has electrical conductivity. For example, the same substances as referenced above as a component material of the source and drain electrodes 3 and 4 can be used. Accordingly, in a manufacturing process of a circuit board to be described later, the source and drain electrodes 3 and 4, the pixel electrodes 41, the connection terminals 8 and the second lines 92 can be formed at the same time in the same process.

As a component material of the first lines 91, in addition to the substances referenced above as a component material of the above-described gate electrode 7, the same substances as referenced above as a component material of the source and drain electrodes 3 and 4 can be used.

Circuit board 10 including a plurality of the thin film transistors 1 may be manufactured through the following processes, for example.

Method Of Manufacturing Circuit Board

FIGS. 3A through 3E and 4F through 4I are diagrams (longitudinal sectional views) for explaining a method of forming thin film transistor 1 part (line A—A in FIG. 2) of the circuit board 10. In the following description, the upper side in FIGS. 3A through 3E and 4F through 4I corresponds to the upper side of the thin film transistor, while the lower side corresponds to the lower side thereof.

A first manufacturing method of the circuit board 10 comprises: (A1) a step of forming source electrodes, drain electrodes, pixel electrodes, lines and connection terminals; (A2) a step of removing organic substances; (A3) a step of forming an organic semiconductor layer; (A4) a step of forming a gate insulating layer; and (A5) a step of forming lines (gate electrodes). Each step will be described below sequentially.

(A1) Step of Forming Source Electrodes, Drain Electrodes, Pixel Electrodes, Lines and Connection Terminals The source and drain electrodes 3 and 4, the pixel electrodes 41, the connection terminals 8 and the second lines 92 can be formed by forming a film (conductive film) composed of a conductive material, and thereafter removing unwanted portions. The film composed of a conductive material is formed by, for example, chemical vapor deposition (CVD) such as plasma CVD, thermal CVD or laser CVD, dry plating such as vapor deposition, sputtering or ion plating, wet plating such as electrolytic plating, immersion plating or electroless plating, spraying, a sol-gel method or metal organic decomposition (MOD) or other known processes. In particular, the conductive film is preferably formed by electroless plating. The use of electroless plating enables the source and drain electrodes 3 and 4, the pixel electrodes 41, the connection terminals 8 and the second lines 92 to be easily formed with high deposition accuracy at low costs without a large-scale apparatus such as a vacuum apparatus.

The case of using electroless plating for forming the source and drain electrodes 3 and 4, the pixel electrodes 41, the connection terminals 8 and the second lines 92 will be described below by way of example. It is appreciated that the various items found in step A1 may be formed simultaneously or separately or in various combinations without departing from the scope of aspects of the invention.

Figure 3A:
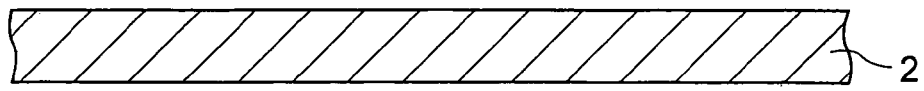
FIG. 3A through 3E are diagrams (longitudinal sectional views) for explaining a method of forming a thin film transistor part (line A—A in FIG. 2) of the circuit board of aspects of the present invention.

(A1-1) First the substrate 2 such as that shown in FIG. 3A is prepared, and then the substrate 2 is cleaned with one or an adequate combination of water (deionized water or the like), an organic solvent, etc. This cleaning improves the wettability of the substrate 2 to water and thus is easier for various treatment liquids described below to contact the substrate 2.

In the case of using a substrate composed of resin such as polyimide as the substrate 2, it is preferable that for a surface of the substrate 2 on which the source and drain electrodes 3 and 4, the pixel electrodes 41, the connection terminals 8 and the second lines 92 are formed, adhesiveness improving treatment for enhancing the adhesiveness between these elements and the substrate 2 is carried out prior to the present step (A1-1) (step (A1)).

This adhesiveness improving treatment (surface roughening) is carried out by etching the surface of the substrate 2 with an etchant, and then treating the surface with a treatment liquid including a reducing agent.

For example, a liquid containing a transition metal oxide such as $CrO_3$ or $MnO_2$ and an inorganic acid such as a sulfuric acid or hydrochloric acid among others can be used as the etchant.

Meanwhile, it is preferable that an agent that does not contain alkali metal elements substantially is used as the reducing agent used as treatment liquid, although alternative agents may be used. This avoids that alkali metal ions are trapped in the surface of the substrate 2, and thus preventing the diffusion (mixing) of alkali metal ions into the organic semiconductor layer 5 to be formed in the later process. As a result, the deterioration of the characteristics of the organic semiconductor layer 5 can be prevented.

Ammonium compounds such as ammonium sulfite hydrate and ammonium hypophosphite, hydrazine, etc. may be used as a reducing agent. Of these substances, an ammonium compound is preferable as a main component of a reducing agent, and ammonium sulfite hydrate is more preferable. An ammonium compound (particularly ammonium sulfite hydrate) is preferable because of excellent reducing properties.

(A1-2) Next, pre-treatment for forming a plated film 11 is carried out for the substrate 2.

This pre-treatment is carried out by bringing a solution (surfactant solution) including a cationic surfactant or an anionic surfactant into contact with the substrate 2. This allows the cationic surfactant or anionic surfactant to be adhered to the surface of the substrate 2.

The surface of the substrate 2 is positively charged when a cationic surfactant adheres thereto, while being negatively charged when an anionic surfactant adheres thereto. If the charge polarity of a catalyst used in electroless plating is opposite to the charging of the substrate surface, the catalyst is easily adsorbed. As a result, the adhesiveness between the plated film 11 (source and drain electrodes 3 and 4, pixel electrodes 41, connection terminals 8 and second lines 92) to be formed and the substrate 2 is enhanced.

For example, a method of immersing the substrate 2 in a surfactant solution (immersion method) and a method of showering (spraying) the substrate 2 with a surfactant solution are listed as a method of contacting a surfactant solution with the substrate 2. The immersion method is preferable in particular. The immersion method enables a large amount of the substrates 2 to be easily treated.

Although there are various methods for contacting a liquid with the substrate 2 as above, the case of using an immersion method as a method of contacting a liquid will be described as representation in the following processes.

Examples of a cationic surfactant include, for example, alkyl ammonium chloride, benzalkonium chloride, benzethonium chloride and an stearic acid. One or a combination of two or more of these substances can be used.

The temperature of the surfactant solution for treatment is preferably about 0–70° C., and is more preferably about 10–40° C.

Also, the treatment time for the substrate 2 in a surfactant solution is preferably about 10–90 seconds, and is more preferably about 30–60 seconds.

The substrate 2 thus pre-treated is cleaned with using, for example, deionized water (ultrapure water), ion exchange water, distilled water or reverse osmosis (RO) water.

(A1-3) Next, a catalyst is adsorbed (attached) to the surface of the substrate 2.

As a catalyst, Au, Ag, Pd, Pt, Ni, etc. are listed. One or a combination of two or more of these elements can be used.

In the case of using Pd as a catalyst out of these elements, the substrate 2 is immersed in a colloidal suspension of a Pd alloy such as Sn—Pd or a solution of an ionic Pd catalyst such as palladium chloride, thereby allowing a Pd alloy or ionic Pd catalyst to be adsorbed (attached) to the surface of the substrate 2. Thereafter elements irrelevant to catalyzing are removed, whereby Pd is exposed on the surface of the substrate 2.

For example, in the case of using an Sn—Pd colloidal suspension, the substrate 2 is immersed in the colloidal suspension and then is immersed in an acid solution. By doing so, Sn coordinated to Pd is dissolved so as to be removed, with the result that Pd is exposed on the surface of the substrate 2.

For example, a solution including an acid such as HBF4 and a reducing agent such as glucose, or a solution prepared by further adding a sulfuric acid to the solution can be used as the acid solution.

The temperature of the solution including a catalyst for treatment is preferably about 0–70° C., and is more preferably about 10–40° C.

Also, the treatment time for the substrate 2 in the solution including a catalyst is preferably from about 10 seconds to about 5 minutes, and is more preferably from about 20 seconds to about 3 minutes.

Meanwhile, the temperature of the acid solution for treatment is preferably about 0–70° C., and is more preferably about 10–40° C.

The treatment time for the substrate 2 in the acid solution is preferably from about 10 seconds to about 5 minutes, and is more preferably from about 30 seconds to about 3 minutes.

The substrate 2 to which a catalyst has been thus attached (adsorbed) is cleaned with using, for example, deionized water (ultrapure water), ion exchange water, distilled water or RO water.

Figure 3B:
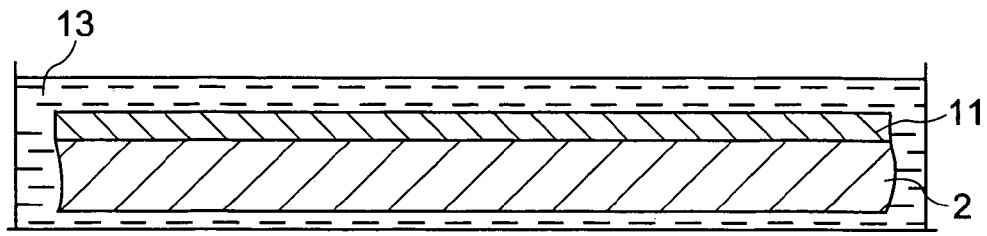

(A1-4) Subsequently, as shown in FIG. 3B, the substrate 2 is immersed in a plating solution 13, thereby allowing metallic elements (elemental metal) to precipitate on the surface of the substrate 2 to form the plated film 11.

As the plating solution 13 used for electroless plating, a liquid that includes a metal salt of a metal for forming the plated film 11 (the source and drain electrodes 3 and 4, the pixel electrodes 41, the connection terminals 8 and the second lines 92) and a reducing agent, but not substantially including any alkali metal ions, is preferably used.

That is, when preparing the plating solution 13 by resolving at least a metal salt and a reducing agent into the solvent, substances that do not include an alkali metal as a component element thereof are preferably used as a composition of the plating solution 13.

This prevents the mixing of alkali metal ions into the plated film 11 to be formed. As a result, the diffusion (mixing) of alkali metal ions into the organic semiconductor layer 5 to be formed in the later process is prevented, and thus the deterioration of the characteristics of the organic semiconductor layer 5 can be prevented.

As a metal salt, for example, sulfate salt, nitrate salt, or the like is preferably used.

As a reducing agent, for example, hydrazine and ammonium hypophosphite can be used. Of these substances, at least one of hydrazine and ammonium hypophosphite is preferably used as a main component of a reducing agent. By using these materials as a reducing agent under appropriate temperature and pH of the plating solution, the deposition rate of the plated film 11 is made proper. Thus the thickness of the film can easily be controlled so as to be within the optimum range of film thickness required for the source and drain electrodes 3 and 4, the pixel electrodes 41, the connection terminals 8 and the second lines 92. Furthermore, the resulting plated film 11 can also have an even thickness and preferable surface property (good film surface morphology).

The amount of a metal salt included in the plating solution 13 (the amount of a metal salt added to a solvent) is preferably about 1–50 g/L, and is more preferably about 5–25 g/L. If the content of a metal salt is too small, it may take a long time to form the plated film 11. In contrast, even if the content of a metal salt is increased beyond the above upper limit, an increase in effectiveness of the solution is not expected.

The amount of a reducing agent included in the plating solution 13 (the amount of a reducing agent added to a solvent) is preferably about 10–200 g/L, and is more preferably about 50–150 g/L. If the amount of a reducing agent is too small, it may be difficult to efficiently reduce metal ions depending on the kind or the like of the reducing agent. In contrast, even if the content of a reducing agent is increased beyond the above upper limit, more effectiveness is not expected.

It is preferable that a pH adjuster (pH buffer) is further mixed (added) to such a plating solution 13. Accordingly, the pH of the plating solution 13 is prevented or suppressed from lowering as the electroless plating proceeds. As a result, the decrease of the deposition rate or changes in the composition or characteristics of the plated film 11 can effectively be prevented.

As such a pH adjuster, although various kinds can be used, an adjuster composed mainly of at least one of ammonia water, trimethyl ammonium hydride, and ammonium sulfide is preferable. Since these substances excel in buffering effect, the use of these materials as a pH adjustor provides the above effectiveness more remarkably.

By immersing the substrate 2 having a catalyst attached thereto in the plating solution 13 described above, the electroless plating reaction is promoted by means of the catalyst as nuclei, thus forming the plated film 11.

The pH of the plating solution 13 for the treatment is preferably about 5–12, and is more preferably about 6–10.

The temperature of the plating solution 13 for the treatment is preferably about 30–90° C., and is more preferably about 40–80° C.

The treatment time for the substrate 2 in the plating solution 13 is preferably from about 10 seconds to about 5 minutes, and is more preferably from about 20 seconds to about 3 minutes.

If the pH and temperature of the plating solution 13 and the treatment time with the plating solution 13 are within the above ranges, the deposition rate becomes particularly proper, and accordingly the plated film 11 having an even thickness can be formed with high precision.

Note that the thickness of the plated film 11 to be formed can be controlled by arranging the plating conditions such as operation temperature (temperature of a plating solution), operation time (plating time), the amount of a plating solution, the pH of a plating solution, or the number of plating processes (the number of turns).

Furthermore, an additive such as a complexing agent or stabilizing agent may be added to the plating solution 13 adequately, if necessary.

As a complexing agent, for example, carboxylic acids such as an ethylenediamine tetra acetic acid and acetic acid, oxycarboxylic acids such as a tartaric acid and citric acid, an aminocarboxylic acid such as glycine, an amine such as triethanolamine, and polyhidric alcohols such as glycerin and sorbitol can be used.

As a stabilizing agent, for example, 2,2'-bipyridyl, cyanide, ferrocyanide, phenanthroline, thiourea, mercaptbenzothiazole, and thioglycolic acid can be used.

The substrate 2 on which the plated film 11 has been thus formed is cleaned by using, for example, deionized water (ultrapure water), ion-exchange water, distilled water or RO water.

(A1-5) Next, on the plated film 11 formed is a resist layer 12 having a shape corresponding to the shapes of the source and drain electrodes 3 and 4, the pixel electrodes 41, the connection terminals 8 and the second lines 92.

Figure 3C:
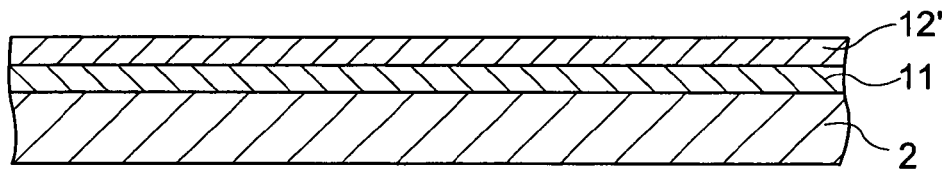
Figure 3D:
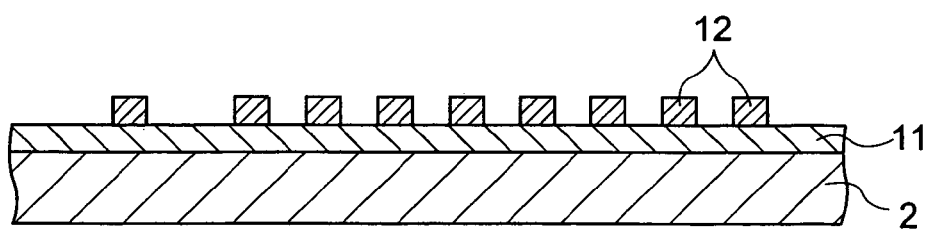

First, as shown in FIG. 3C, a resist material 12' is applied (provided) on the plated film 11. Then, the resist material 12' maybe exposed via a photo mask corresponding to the shapes of the source and drain electrodes 3 and 4, the pixel electrodes 41, the connection terminals 8 and the second lines 92, and then being developed with a developer. These processes form the resist layer 12 patterned into a shape corresponding to the shapes of the source and drain electrodes 3 and 4 and the second lines 92, and also the pixel electrodes 41 and the connection terminals 8 that are not shown in the drawing, as shown in FIG. 3D.

Figure 3E:
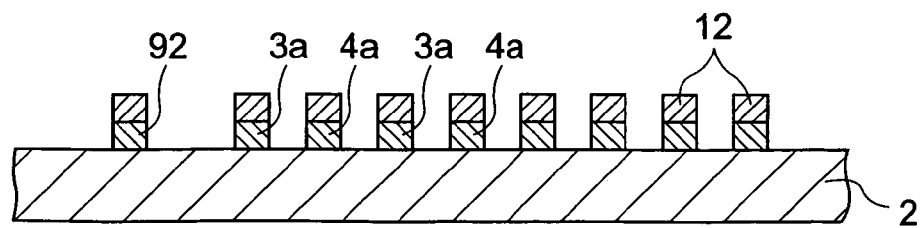

(A1-6) Next, using the resist layer 12 as a mask, unnecessary portions of the plated film 11 are removed by etching as shown in FIG. 3E.

This etching can be carried out by using one or a combination of two or more of plasma etching, reactive etching, beam etching, photo-assist etching, other physical etching methods, wet etching, other chemical etching methods, etc. The wet etching is preferably used, of these etching methods. Thus, the etching process can be carried out with simple apparatuses and steps without using any large-scale apparatus such as a vacuum apparatus.

As an etchant used for wet etching, for example, a solution including ferric chloride, and a solution including a sulfuric acid, nitric acid, or acetic acid can be used.

(A1-7) Subsequently, the resist layer 12 is removed. Thereby the source and drain electrodes 3 and 4 and the second lines 92 shown in FIG. 4F, and also the pixel electrodes 41 and the connection terminals 8 that are not shown in the drawing, are obtained.

A resist remover is preferably used for removing the resist layer 12, and besides, for example, the above physical etching methods can also be used.

As described above, by using photolithography and etching in combination, the source and drain electrodes 3 and 4, the pixel electrodes 41, the connection terminals 8 and the second lines 92 with high dimensional accuracy can easily and surely be formed.

Therefore, the width A of the source electrode fingers 3a and the drain electrode fingers 4a, and the distance (channel length L) between the source electrode finger 3a and the drain electrode finger 4a can be set comparatively shorter, which permits the fabrication of the thin film transistor 1 with a low absolute value of the threshold voltage and large drain current, that is, with excellent characteristics necessary for switching elements.

Note that either of a negative resist material and a positive resist material can be used as a resist material used in photolithography.

In the present embodiment, the description has been made on a method in which the resist layer 12 is formed on the plated film 11 that has been provided on a substrate, and then unnecessary portions of the plated film 11 are removed by etching, as a method of forming the source and drain electrodes 3 and 4, the pixel electrodes 41, the connection terminals 8 and the second lines 92. However, instead of this, the following method may be used to form each element 3, 4, 41, 8 and 92.

Specifically, the resist layer 12 having openings that correspond to the shapes of the elements 3, 4, 41, 8 and 92 is formed on the substrate 2, and then the substrate 2 having the resist layer 12 thereon is immersed in the plating solution 13. Thus a plated film corresponding to the shapes of the elements 3, 4, 41, 8 and 92 is formed. Thereafter the resist layer 12 is removed, thereby resulting in the formation of elements 3, 4, 41, 8 and 92.

(A2) Step of Removing Organic Substances

Subsequently, the substrate 2 having the source and drain electrodes 3 and 4, the pixel electrodes 41, the connection terminals 8, and the second lines 92 formed thereon is cleaned with one or an adequate combination of water (deionized water or the like), an organic solvent, etc.

Then, organic substances existing on the surface of the substrate 2 on which the organic semiconductor layer 5 is to be formed, are removed. This removes the barrier to carriers in the interface between the organic semiconductor layer 5 to be formed in the later process and the source and drain electrodes 3 and 4, enabling the improvement of the characteristics of the thin film transistor 1.

As a method of removing organic substances (removing method), for example, plasma treatment, treatment with ozone water, etching with an acid or alkali, mechanical removal of a surface layer, and ultraviolet rays (UV) (in particular, deep UV) radiation can be used. One or a combination of two or more of these methods can be used. Of these methods, plasma treatment is preferable as a method of removing organic substances. Plasma treatment enables organic substances to be removed surely in a short time.

Plasma treatment may be implemented by carrying the substrate 2 in a chamber equipped with a decompression means and a plasma generation means, and then generating plasma in the chamber in a decompressed condition. Alternately, the plasma treatment may be implemented by using a head that has plasma spray nozzles and splaying the substrate surface with plasma.

In the latter method, plasma treatment can be carried out in the atmospheric pressure (atmospheric pressure plasma treatment). Therefore, the use of a chamber and decompression means is unnecessary, and thus providing advantages since manufacturing costs and time can be reduced.

In the case of atmospheric pressure plasma treatment, the conditions thereof are as follows for example: the gas flow rate is about 10–300 sccm, and the RF power is about 0.005–0.2 W/cm2.

A gas used for generating plasma is preferably, but not limited to, a gas composed mainly of at least one of oxygen, nitrogen, argon, helium, and fluorocarbon. The mixing of argon or helium into the main component enables plasma to be generated in a comparatively low vacuum atmosphere or under the atmospheric pressure, and thus the apparatus can be simplified. Note that the present step (A2) can be omitted according to need.

(A3) Step of Forming Organic Semiconductor Layer

Then, as shown in FIG. 4C; the organic semiconductor layer 5 is formed on the substrate 2 on which the source and drain electrodes 3 and 4, the pixel electrodes 41, the connection terminals 8 and the second lines 92 have been formed, so as to cover the source and drain electrodes 3 and 4.

At this time, the channel regions 51 are formed on regions between the source electrode fingers 3a and the drain electrode fingers 4a.

For example, the organic semiconductor layer 5 can be formed by applying (supplying) a solution including an organic polymer material or a precursor thereof on the substrate 2 by using a coating method so as to cover the source and drain electrodes 3 and 4, and then carrying out a post-process (e.g., heating, irradiation with infrared rays, or provision of ultrasonic waves) for the coating film according to need.

Examples of a coating method include, for example, a spin-coating method, a casting method, a micro gravure coating method, a gravure coating method, a bar coating method, a roller coating method, a wire bar coating method, a dip coating method, a spray coating method, a screen printing method, a flexographic printing method, an offset printing method, an ink jet method, and a micro-contact printing method. One or a combination of two or more of these methods can be used.

Of these methods, an ink jet method is preferably used for forming the organic semiconductor layer 5. Alternatively other methods may be used. An ink jet method allows the organic semiconductor layer 5 to be selectively formed so as to cover only the source and drain electrodes 3 and 4, without supplying a resist layer or the like on the pixel electrodes 41, the connection terminals 8 and the second lines 92. This reduces the amount of a consumed organic semiconductor material, and thereby reducing manufacturing costs.

Also, the region on which the organic semiconductor layer 5 is formed is not limited to that shown in the drawings. The organic semiconductor layer 5 may be formed only in the regions (channel region 51) between the source electrode fingers 3a and the drain electrode fingers 4a. According to this structure, in the case of arranging a plurality of thin film transistors 1 (elements) on a single substrate, leak currents and cross-talk between elements can be suppressed by forming the organic semiconductor layer 5 for each element independently of each other. The use of an ink jet method is also particularly suitable for forming the organic semiconductor layer 5 only in the channel regions 51. Furthermore, the required resolution is 5–100 μm, and therefore matches the resolution by an ink jet method. The use of an ink jet method in forming the organic semiconductor layer 5 for each element independently of each other eliminates the need to use chemicals such as photoresist, a developer or a remover, or plasma treatment such as oxygen plasma or CF4 plasma. Therefore, there are no concerns that the characteristics of the organic semiconductor material changes (for example, since the material is doped) or deteriorates.

In this case, for example, inorganic solvents, various organic solvents, mixed solvents including these solvents, or the like can be used as a solvent for dissolving the organic semiconductor material. Examples of the inorganic solvents include nitric acid, sulfuric acid, ammonia, hydrogen peroxide, water, carbon disulfide, carbon tetrachloride and ethylene carbonate. Also, examples of the various organic solvents include: ketones such as methyl ethyl ketone (MEK), acetone, diethyl ketone, methyl isobutyl ketone (MIBK), methyl isopropyl ketone (MIPK) and cyclohexanon; alcohol solvents such as methanol, ethanol, isopropanol, ethylene glycol, diethylene glycol (DEG) and glycerine; ether solvents such as diethyl ether, diisopropyl ether, 1,2-dimetoxyethane (DME), 1,4-dioxane, tetrahydrofuran (THF), tetrahydropyran (THP), anisole, diethylene glycol dimethyl ether(diglyme) and diethylene glycol ethyl ether (carbitol); cellosolve solvents such as methyl cellosolve, ethyl cellosolve and phenyl cellosolve; aliphatic hydrocarbon solvents such as hexane, pentane, heptane and cyclohexane; aromatic hydrocarbon solvents such as toluene, xylene and benzene; heteroaromatic solvents such as pyridine, pyrazine, furan, pyrrole, thiophene and methylpyrrolidone; amide solvents such as N, N-dimethylformamide (DMF) and N,N-dimethylacetamide (DMA); halogenated compound solvents such as dichloromethane, chloroform and 1,2-dichloroethane; ester solvents such as ethyl acetate, methyl acetate and ethyl formate; sulfur compound solvents such as dimethyl sulfoxide (DMSO) and sulfolane; nitrile solvents such as acetonitrile, propionitrile and acrylonitrile; and organic acid solvents such as formic acid, acetic acid, trichloroacetic acid and trifluoroacetic acid.

An organic semiconductor material includes a conjugated system such as an aromatic hydrocarbon group or a heterocyclic group, and therefore is prone to be dissolved with an aromatic hydrocarbon solvent in general. Toluene, xylene, trimethylbenzene, tetramethylbenzene, cyclohexylbenzene, and and the like are particularly suitable solvents.

(A4) Step of Forming Gate Insulating Layer

Figure 4F:
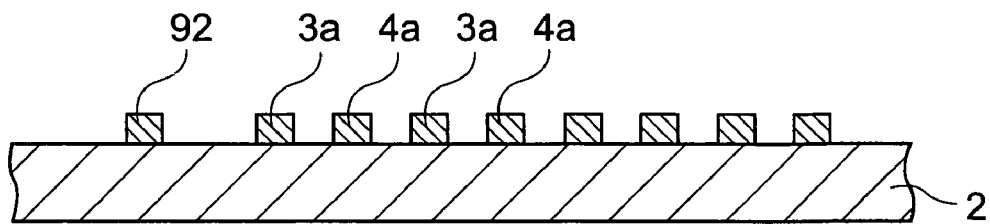
FIGS. 4F through 4I are diagrams (longitudinal sectional views) for explaining the method of forming a thin film transistor part (line A—A in FIG. 2) of the circuit board of aspects of the present invention.
Figure 4G:
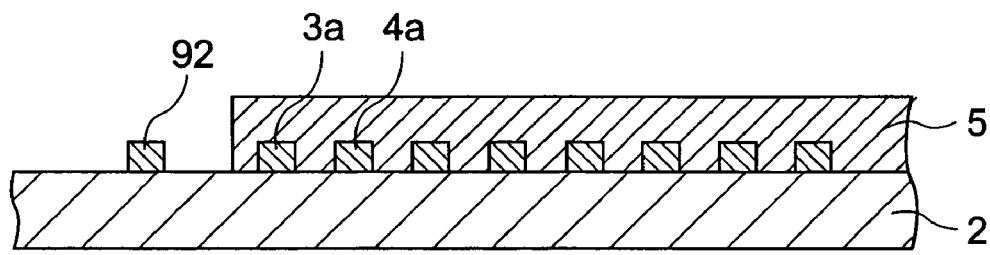
Figure 4H:
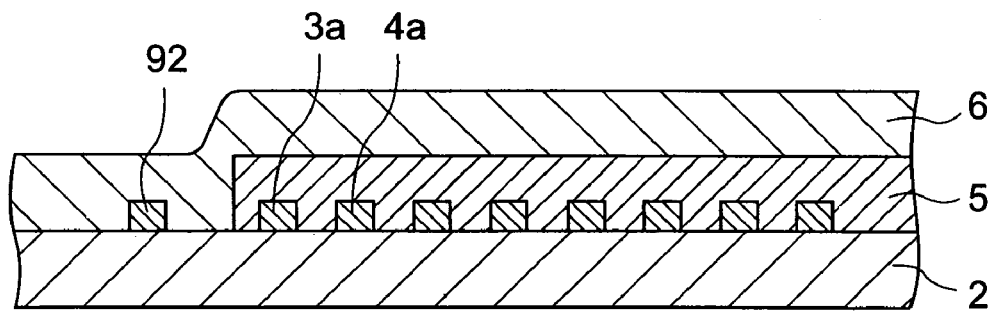

Next, as shown in FIG. 4H, the gate insulating layer 6 is formed so as to cover the organic semiconductor layer 5 and the second lines 92, and also the pixel electrodes 41 that are not shown in the drawing.

For example, the gate insulating layer 6 can be formed by applying (supplying) a solution including an insulating material or a precursor thereof on the organic semiconductor layer 5 by using a coating method, and then carrying out a post-process (e.g., heating, irradiation with infrared rays, or provision of ultrasonic waves) for the coating film according to need.

The same method as above can be used as the coating method. If the organic semiconductor layer 5 is composed of a soluble organic semiconductor material, a solvent that does not swell nor dissolve the organic semiconductor layer 5 is preferably selected as the solvent for the insulating material. As described above, since an organic semiconductor material is easily dissolved with an aromatic hydrocarbon solvent, it is more preferable to avoid the use of such solvents when coating insulating materials. Namely, water solvents, alcohol solvents, ketone solvents, ether solvents, ester solvents, aliphatic hydrocarbon solvents, or fluorinated solvents are preferably used.

Although the gate insulating layer 6 has a structure covering the organic semiconductor layer 5, the pixel electrodes 41 and the second lines 92 in the present embodiment, the gate insulating layer 6 is not limited to such a structure but may be formed only on the organic semiconductor layer 5. A spin coating method is suitable for the former structure, while an ink jet method is suitable for the latter. If the gate insulating layer 6 is formed by a spin coating method, the connection terminals 8 are also covered. However, this covering may not be desirable in a step of forming lines to be described next. Thus, it is useful to remove the gate insulating layer 6 on the connection terminals 8, particularly on the first terminals 81 connected to the first lines 91. The following method can be used for this.

The connecting terminals 8 are previously covered (masking) with a resin adhesive tape before spin coating. Next, the adhesive tape is removed after spin coating, whereby the connecting terminals 8 have no gate insulating layer 6 thereon so as to be exposed.

Alternately, the gate insulating layer 6 can partially be removed by dropping a solution via an ink jet method on the gate insulating layer 6 that has been formed over the entire surface by spin coating. In this case, the solution is dropped such that holes are opened in the parts of the gate insulating layer 6 that correspond to the connection terminals 8. The dropped solution dries after dissolving the gate insulating layer 6. At this time, the insulating material that has been once dissolved in the solution re-precipitates in the periphery of the droplet of the solution, and thus a hole is opened around the center of the droplet. If a hole does not penetrate to the connection terminal 8 with droplets of one discharge, the repetition of dropping and drying of droplets for the same place allows the hole to reach the connection terminal 8.

Also, instead of dropping a solution by an ink jet method above the connection terminal 8 after alignment, it is also effective to disperse a solvent in a spraying manner for the removal of the gate insulating layer 6. This method uses a simpler device than the ink jet method, while providing high productivity. In order to limit areas sprayed with droplets, a slit aperture may be inserted between spray nozzles and the device (circuit board 10).

It is also effective to use a needle tool for opening holes in the gate insulating layer 6. If the gate insulating layer 6 is made of a polymer, the substrate 2 is a hard material such as glass, and the connection terminals 8 are metal, it is particularly easy to make a hole. More specifically, since the gate insulating layer 6 is less hard than the substrate 2 and the connection terminals 8 in this case, perforating or scratching the gate insulating layer 6 with a metal probe pin permits the partial removal of the gate insulating layer 6. Since the substrate is made of a hard material, it is sufficient to control the pressure of the pin such that the pin itself is not damaged.

In contrast, if the substrate 2 is made of plastic, it is necessary to control the pressure so as not to perforate the connection terminal 8 with the pin. The control of the pin would be easy if the connection terminal 8 is substantially thick (200 nm or more). Therefore, it is effective to increase the thickness of metal layers only for the connection terminals 8. The most suitable method for this purpose is electroless or electrolytic plating. Plating with exposing only the connection terminals 8 or immersing only the connection terminals 8 in a plating solution enables the thickness of metal layers to be at least partially increased.

Alternately, the gate insulating layer 6 that has been formed over the entire surface by spin coating may be exposed to plasma to be removed. If the gate insulating layer 6 is made of such a polymer as has been described in the present embodiment, the gate insulating layer 6 can partially be removed by placing the device (circuit board 10) in plasma in the presence of an oxygen gas or mixed gas of oxygen and CF4. In this case, however, since only the gate insulating layer 6 on the connection terminals 8 needs to be removed partially, other parts should be masked. The gate insulating layer 6 on the connection terminals 8 can be removed by covering the organic transistor part with a metal plate mask and then exposing the device to plasma. The plasma has no influence on other parts, which are covered with the metal mask.

Alternately, if the connection terminals 8 are located at the edges of the substrate 2, immersing only the edges in a solvent to remove the gate insulating layer 6 is also available.

(A5) Step of Forming Lines (Gate Electrodes)

Figure 4I:
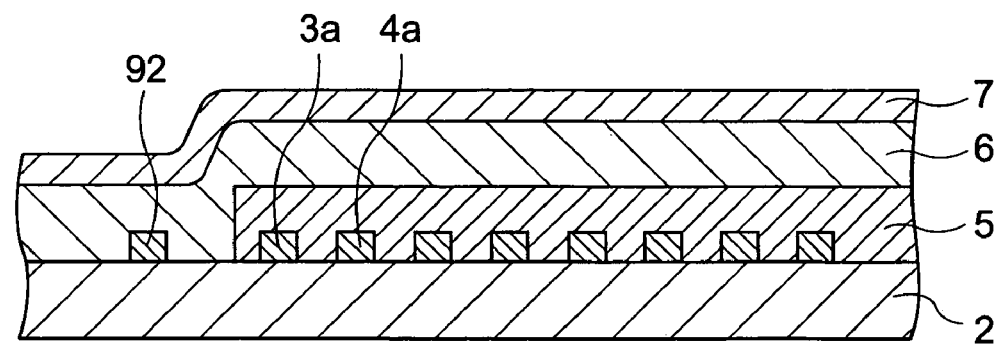

Next, as shown in FIG. 4I, the first line 91 (gate electrode 7) is formed on the gate insulating layer 6.

The first line 91 can be formed through the following method, for example.

First a liquid material including electrical conductive particles is supplied in an almost straight line by using a coating method in order to form the gate electrode 7 for the thin film transistors 1 arranged in one line, thereby forming a coating film.

The conductive particles are composed of the above-described conductive material (metal material or metal oxide material).

The same method as described above can be used as a coating method. The use of an ink jet method is particularly preferable. The ink jet method enables the liquid material to be supplied accurately corresponding to the first lines 91. Thus the first lines 91 can be formed with high dimensional accuracy.

The later post process (e.g., heating, irradiation with infrared rays, or provision of ultrasonic waves) for the coating film (liquid material) allows the formation of the first wires 91.

The case of using an ink jet method to form the first lines 91 will be described below as an illustration.

The ink jet method allows patterning by discharging droplets of a liquid material including conductive particles (it is referred to as ink hereinafter) from nozzles of a droplet discharge head.

The viscosity (at room temperature) of the ink is preferably, but not limited to, about 2–20 cps in general, and is more preferably about 4–8 cps. If the viscosity of the ink is within this range, droplets can more stably be discharged from nozzles. If the viscosity of the ink is smaller than the above range, the vibration of a piezo element, which is displaced when discharging, has a reduced tendency to be attenuated, and therefore discharging is prone to be unstable. Meanwhile, if the viscosity of the ink is larger than the above range, the flow channel resistance of the ink is large. Therefore the supply of the ink becomes insufficient in high-speed printing, causing unstable discharging.

Also, the volume (in average) of one ink droplet is preferably, but not limited to, about 0.1–40 pL in general, and is more preferably about 1–30 pL. Setting the volume (in average) of a single droplet within this range allows the formation of more accurate shapes. If the volume of an ink droplet is too small, ink droplets needs to be discharged at high speed. An ink jet head that satisfies this high-speed discharging is expensive. In addition, obtaining required film thickness is also difficult and repeated printing is necessary, lowering the productivity. Meanwhile, if an ink droplet is too large in size, the resolution of printing is lowered, as is obvious, making the features of an ink jet method ineffective.

Such materials as will be described in <A> and <B> below, for example, can be used as the ink.

<A> In the case of making up the first lines 91 (gate electrode 7) of a metal material or metal oxide material, a dispersion liquid including conductive particles (metal particles or metal oxide particles) can be used as an ink (liquid material).

In this case, the content of the conductive particles in the ink is preferably, but not limited to, about 1–40 wt %, and is more preferably about 10–30 wt %.

Also, the average particle diameter of the used conductive particles is preferably, but not limited to, about 1–100 nm, and is more preferably about 2–30 nm.

Furthermore, particles coated with a coagulation inhibition agent (dispersant) for inhibiting coagulation at a room temperature are preferably used for the conductive particles. As the coagulation inhibition agent, for example, compounds having a group including a nitrogen atom such as alkylamine, compounds having a group including an oxygen atom such as alkanediol, and compounds having a group including a sulfur atom such as alkylthiol and alkanethiol can be used. Propylene glycol, trimethylene glycol, ethylene glycol or butanediol is preferable as an alkanediol.

In this case, a remover capable of removing the coagulation inhibition agent by a predetermined process (e.g., heating or the like) is added into the ink. For example, examples of the remover include various carboxylic acids such as linear or branched saturated carboxylic acids of one to ten carbon atoms, unsaturated carboxylic acids and dibasic acids. As the saturated carboxylic acids, a formic acid, acetic acid, propionic acid, butanoic acid, hexanoic acid and octylic acid may be used. As the unsaturated carbonic acids, an acrylic acid, methacrylic acid, crotonic acid, cinnamic acid, benzoic acid and sorbic acid may be used. As the dibasic acids, an oxalic acid, malonic acid, sebacic acid, maleic acid, fumaric acid and itaconic acid may be used. Also, examples of the remover include organic acids such as various phosphoric acids and various sulfonic acids that are obtained by substituting phosphate groups or sulfonyl groups for carboxyl groups of the above carboxylic acids, and organic acid esters derived from the organic acids. In addition, examples of the remover also include: aromatic acid anhydrides such as phthalic anhydride, trimellitic anhydride, pyromellitic dianhydride, benzophenone tetracarboxylic dianhydride, ethylene glycol bis(anhydro trimellitate) and glycerol tris(anhydro trimellitate); cyclic fatty acid anhydrides such as maleic anhydride, succinic anhydride, tetrahydrophthalic anhydride, methyltetrahydrophthalic anhydride, methyl nadic anhydride, alkenyl succinic anhydride, hexahydrophthalic anhydride, methylhexahydrophthalic anhydride and methylcyclohexene tetracarboxylic dianhydride; and fatty acid anhydrides such as poly(adipic anhydride), poly(azelaic anhydride) and poly(sebacic anhydride).

As a dispersion medium, for example, terpineol, mineral spirit, xylene, toluene, ethyl benzene, mesitylene, hexane, heptane, octane, decane, dodecane, cyclohexane, cyclooctane, ethanol, isopropanol (IPA), water, or a mixed liquid including these substances can be used. Of these substances, a dispersion medium including water is preferably used in particular.

Furthermore, precursors of various thermoset resins such as phenol resin, epoxy resin, unsaturated polyester resin, vinylester resin, diallyl phthalate resin, oligoester acrylate resin, xylene resin, bismaleimide triazine resin, furan resin, urea resin, polyurethane resin, melamine resin, or silicone resin may be added into (mixed with) the ink.

Note that the viscosity of the ink can be adjusted by, for example, adequately setting the content of conductive particles, the kind or composition of a dispersion medium, and the presence or absence, or the kind of additives.

<B> In the case of making up the first lines 91 (gate electrode 7) of a metal material, a dispersion liquid including a reducing agent and metal oxide particles composed of a metal oxide material that is reduced so as to become a metal material can be used as the ink.

In this case, the content of the metal oxide particles in the ink is preferably, but not limited to, about 1–40 wt %, and is more preferably about 10–30 wt %.

Also, the average particle diameter of the used metal oxide particles is preferably, but not limited to, 100 nm or less, and is more preferably 30 nm or less.

As the reducing agent, for example, an ascorbic acid, hydrogen sulfide, oxalic acid, and carbon monoxide can be used.

As the dispersion medium, for example, a low viscosity oil such as butyl cellosolve or polyethylene glycol, an alcohol such as 2-propanol, or a mixed liquid including these substances can be used.

Note that the viscosity of the ink can be adjusted by, for example, adequately setting the content of the metal oxide particles, the kind or composition of the dispersion medium, etc.

Then, post treatment (e.g., heating, irradiation with infrared rays, or provision of ultrasonic waves) is implemented for the coating film (liquid material) that has been supplied on the gate insulating layer 6 while corresponding to the shape of the first lines 91, thereby forming the first lines 91.

Although a method for the post treatment is not particularly limited as long as the method can remove substances (e.g., a dispersion medium, coagulation inhibition agent, and remover) that are included in the liquid material and should be removed, a method employing heat treatment is preferably used. Heat treatment enables such substances to be removed easily and surely. As a result, a porous film (first line 91) having higher porosity is obtained.

Heating temperature in the heat treatment is preferably 200° C. or less, and is more preferably 150° C. or less. Also, it is further preferably 120° C. or less. This temperature range prevents the lowering of the porosity due to the excessive densification of the porous film.

In addition, setting of such heating temperature allows a part of the substances that should be removed to turn to the above-described carbon atoms or carbon compounds so as to remain in pores of the porous film (first line 91). Thus, such a method can reduce processes and therefore is advantageous compared with a process in which such carbon atoms or carbon compounds are provided in pores after a porous film is formed.

Through the above steps, the circuit board 10 including a plurality of thin film transistors 1 that is shown in FIG. 2 is obtained.

In such a manufacturing method, the electroless plating is used as a method of forming the source and drain electrodes 3 and 4 while the organic semiconductor layer 5, the gate insulating layer 6, and the gate electrode 7 are formed by a coating method. Therefore, the thin film transistor 1 can be manufactured with simple processes at lower costs without requiring any large-scale apparatus such as a vacuum apparatus.

Also, by using electroless plating as a method of forming the source and drain electrodes 3 and 4, these electrodes can be formed with high dimensional accuracy, resulting in the fabrication of the thin film transistor 1 having superior characteristics (switching characteristics).

Furthermore, by using a plating solution substantially free of alkali metal ions as the plating solution 13 used for the electroless plating, the mixing of alkali metal ions into the source and drain electrodes 3 and 4 can be prevented, and thus avoiding the diffusion of alkali metal ions into the organic semiconductor layer 5. This avoids the deterioration of the characteristics of the organic semiconductor layer 5, with the result that the thin film transistor 1 having superior characteristics required for a switching element can be manufactured.

Moreover, the implementation of the step of removing organic substances described in step (A2) further enhances the characteristics of the thin film transistor 1.

Furthermore, by using atmospheric pressure plasma as the method of removing organic substances in step (A2) while using wet-etching as the method of removing the plated film 11 in step (A1), all manufacturing steps for the thin film transistor 1 can be carried out under the atmospheric pressure, and therefore the manufacturing costs and time can be reduced.

Display

A display incorporating the above-described circuit board 10 will now be described with taking an electrophoretic display as an example.

Figure 5:
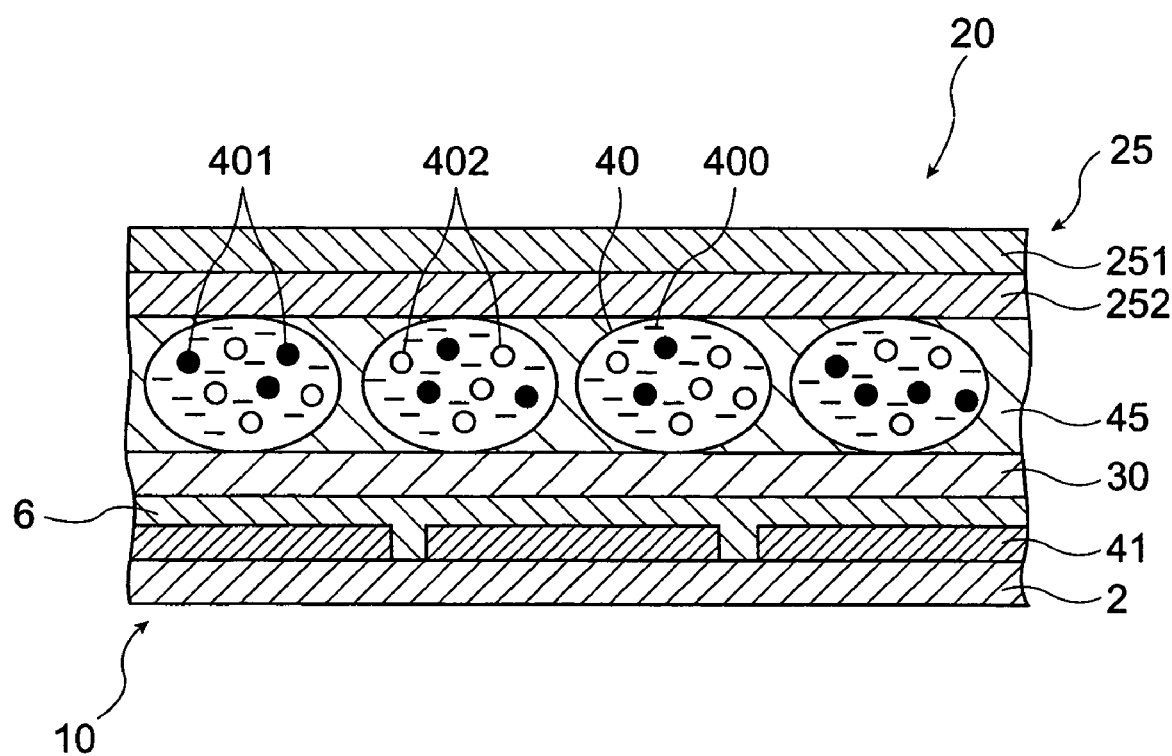
FIG. 5 is a longitudinal sectional view showing an embodiment of applying the circuit board of aspects of the present invention to an electrophoretic display.

FIG. 5 is a longitudinal sectional view showing an embodiment of applying the circuit board 10 of the present invention to an electrophoretic display.

An electrophoretic display 20 shown in FIG. 5 is composed of the circuit board 10 and an electrophoretic display part 25 provided on the circuit board 10.

As shown in FIG. 5, the electrophoretic display part 25 includes a facing substrate 251, a counter electrode 252, microcapsules 40 and a binder 45.

The counter electrode 252 is deposited on the facing substrate 251. The micro capsules 40 (display media) are fixed onto the counter electrode 252 with the binder 45.

The pixel electrodes 41 included in the circuit board 10 are separated in a matrix, that is, in such a manner of being arranged regularly along the vertical and horizontal directions. Each pixel electrode 41 is connected to the drain electrode 4 of the thin film transistor 1 and is covered by the gate insulating layer 6.

The electrophoretic display part 25 is joined to the circuit board 10 with the intermediary of a protective film 30 that is provided closer to the circuit board 10 than the microcapsules 40 (display media) so as to cover the thin film transistors 1 and the pixel electrodes 41.

The protective film 30 has functions to protect the thin film transistor 1 mechanically, and to prevent the diffusion of organophilic liquids toward the circuit board 10.

Each of the capsules 40 contains an electrophoretic dispersion liquid 400 including plural kinds of electrophoretic particles having different characteristics from each other. In the present embodiment, the electrophoretic dispersion liquid 400 includes two kinds of electrophoretic particles 401 and 402 having opposite charge polarities and different colors (hues).

Also, terminals of an IC for driving are connected to the connection terminals 8 (terminals 81 and 82) included in the circuit board 10, whereby ON/OFF switching of the thin film transistor 1 (switching element) incorporated in the circuit board 10 is possible.

Specifically, in such an electrophoretic display 20, the supply of selection signals (selection voltages) to one or more of the lines 91 allows the thin film transistors 1 connected to the lines 91 to which the selection signals (selection voltages) have been supplied, to be switched ON.

Thus, the lines 92 and the pixel electrodes 41 connected to such thin film transistors 1 are electrically connected to each other substantially. If desired data (voltage) is supplied to the lines 92 in this state, the data (voltage) is supplied to the pixel electrodes 41.

At this time, an electric field is generated between the pixel electrodes 41 and the counter electrode 252. The electrophoretic particles 401 and 402 are electrophoresed toward either of the electrodes in accordance with the direction and strength of the electric field, the characteristics of the electrophoretic particles 401 and 402, and and the like.

Meanwhile, in this state, when the supply of the selection signals (selection voltages) to the lines 91 is stopped, the thin film transistors 1 are switched OFF and therefore the lines 92 and the pixel electrodes 41 connected to the thin film transistors 1 are electrically isolated from each other.

Therefore, adequate combinations of the supply and stop of selection signals to the lines 91, and that of data to the lines 92 permit the displaying of desired images (information) on the display surface side (facing substrate) of the electrophoretic display 20.

In particular, in the electrophoretic display 20 of the present embodiment, the electrophoretic particles 401 and 402 are differently colored, and thus enabling images of multiple grayscale to be displayed.

Furthermore, since the electrophoretic display 20 of the present embodiment is equipped with the circuit board 10, the thin film transistors 1 connected to the specific lines 91 can selectively be switched ON/OFF. Therefore, the problem of cross-talk is hardly caused and the speed of the circuit operation can be increased, and thus high quality images (information) can be obtained.

In addition, the electrophoretic display 20 of the present embodiment is operated with lower drive voltages, enabling lower power consumption.

Such an electrophoretic display 20 can be manufactured as follows, for example.

First the circuit board 10 and the electrophoretic display part 25 are previously manufactured.

Then, the protective film 30 is formed on at least one of the surface of the circuit board 10 on the gate insulating film 6 side and the surface of the electrophoretic display part 25 on the microcapsules 40 side.

Subsequently, for example, the circuit board 10 and the electrophoretic display part 25 are pressed so as to become close to each other while heat is applied thereto, in a state in which the gate insulating film 6 of the circuit board 10 is contacted to the microcapsules 40 of the electrophoretic display part 25 with the intermediary of the protective film 30. Thus, the protective film 30 functions as a binder and therefore the circuit board 10 is joined to the electrophoretic display part 25, manufacturing the electrophoretic display 20.

For the electrophoretic dispersion liquid 400 contained in each capsule 40 (display medium), the above-described aromatic hydrocarbons are used as a dispersion medium. These substances are liquids having high organophilicity (lipid solubility).

In the case of omitting the formation of the protective film 30, pressing the circuit board 10 and the electrophoretic display 25 in manufacturing the electrophoretic display 20 causes pressure and shear stress to be directly placed on the thin film transistors 1, the microcapsules 40, etc. If the microcapsules 40 burst (are damaged) in the pressing, the electrophoretic dispersion liquid 400 in the microcapsules 40 flows out.

Since the dispersion medium included in the electrophoretic dispersion liquid 400 has high organophilicity (lipid solubility), if the electrophoretic dispersion liquid 400 flows outside the microcapsules 40, the electrophoretic dispersion liquid 400 infiltrates (diffuses) into the gate insulating layer 6 and the organic semiconductor layer 5 so as to dissolve or swell the component materials of these elements. If the component material (organic semiconductor material) of the organic semiconductor layer 5 is dissolved or swelled in particular, the characteristics of the thin film transistor 1 deteriorate.

In contrast, the electrophoretic display 20 has the protective film 30. Therefore, even if the microcapsules 40 burst and the electrophoretic dispersion liquid 400 flows out, the presence of the protective film 30 prevents the organic semiconductor layer 5 from dissolving or swelling. Thus, the deterioration of the characteristics of the thin film transistor 1 can be prevented adequately.

A material composed mainly of a hydrophilic material, particularly a hydrophilic polymer material is preferable for the component material of the protective film 30. By using such a polymer material, the formation of the protective film 30 is facilitated while it can adequately be prevented or suppressed that shear stress is placed on the thin film transistors 1, the microcapsules 40, etc. Thus damages to the thin film transistors 1, the microcapsules 40 and so forth can more surely be avoided.

As a polymer material having hydrophilicity, for example, a material composed mainly of a polymer including vinyl alcohol such as polyvinyl alcohol, ethylene-vinyl alcohol copolymer, vinyl chloride-vinyl alcohol copolymer or vinyl acetate-vinyl alcohol copolymer is preferable. These substances have particularly high hydrophilicity and therefore can more surely prevent the entrance of the organophilic liquid into the circuit board 10 through the protective film 30.

If a plastic material is used for the substrate 2, the transmittance of the substrate 2 for the organophilic liquid can be set higher than that of the protective film 30 for the organophilic liquid. In this case, the risk of the organophilic liquid vapor accumulating in the organic semiconductor layer 5 is reduced. Specifically, although a small amount of the organophilic liquid vapor that has permeated the protective film 30 passes through the porous gate electrode so as to reach the organic semiconductor layer 5, the vapor is immediately discharged from the substrate 2 side.

The electrophoretic display 20 of the present embodiment has a structure in which a plurality of microcapsules 40 enclosing the electrophoretic dispersion liquid 400 is interposed between the pixel electrodes 41 and the counter electrode 252. However, the electrophoretic display 20 may have a structure in which a plurality of spaces (cells) is delimited with partitions and the electrophoretic dispersion liquid 400 is enclosed in each space. The electrophoretic display 20 having such a structure also adequately exerts the above-described operations and advantageous effects.

Note that the display of the present invention is not limited to the application to such an electrophoretic display 20, but can also be applied to liquid crystal displays, organic or inorganic EL displays and the like.

Electronic Equipment

Such an electrophoretic display 20 can be incorporated in various electronic equipment. Electronic equipment of the present invention equipped with the electrophoretic display 20 will be described below.

Electronic Paper

First an embodiment of applying the electronic equipment of the present invention to an electronic paper will now be explained.

Figure 6:
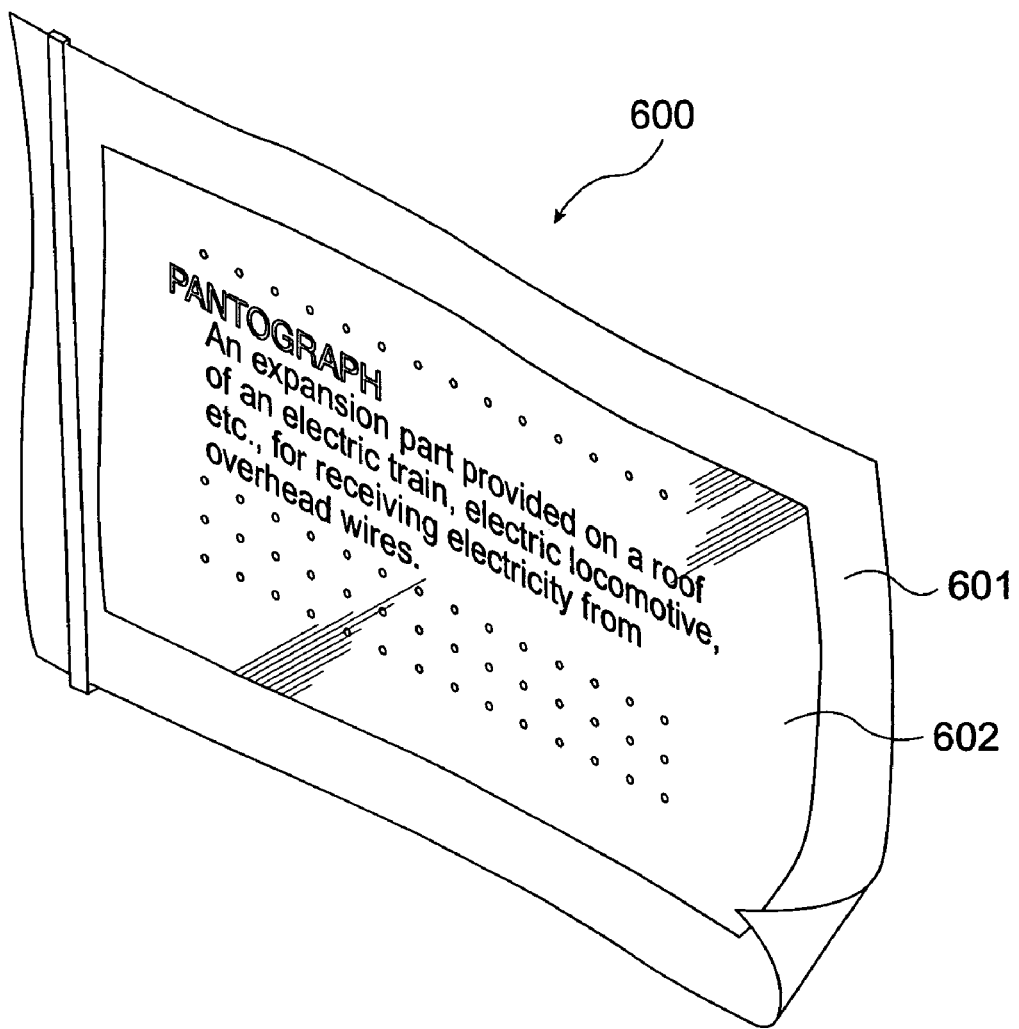
FIG. 6 is a perspective view showing an embodiment of applying a display device of aspects of the present invention to an electronic paper.

FIG. 6 is a perspective view showing an embodiment of applying electronic equipment of the present invention to an electronic paper.

An electronic paper 600 shown in this drawing is equipped with a main body 601 composed of a rewritable sheet having the same texture and flexibility as a paper, and a display unit 602.

In such an electronic paper 600, the display unit 602 is composed of the above-described electrophoretic display 20.

Display

Next, an embodiment of applying the electronic equipment of the present invention to a display will be described.

Figure 7A:
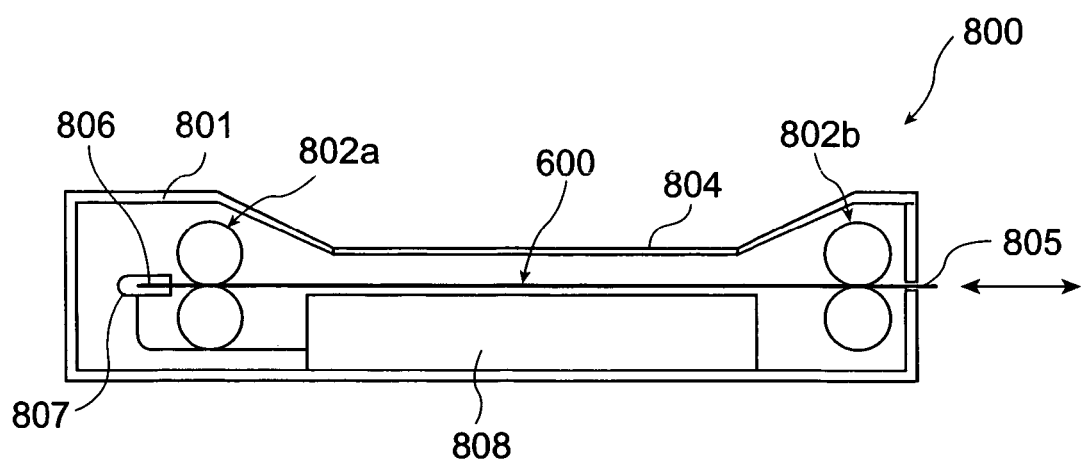
FIGS. 7A and 7B are diagrams showing an embodiment of applying the display device of aspects of the present invention to a display.
Figure 7B:
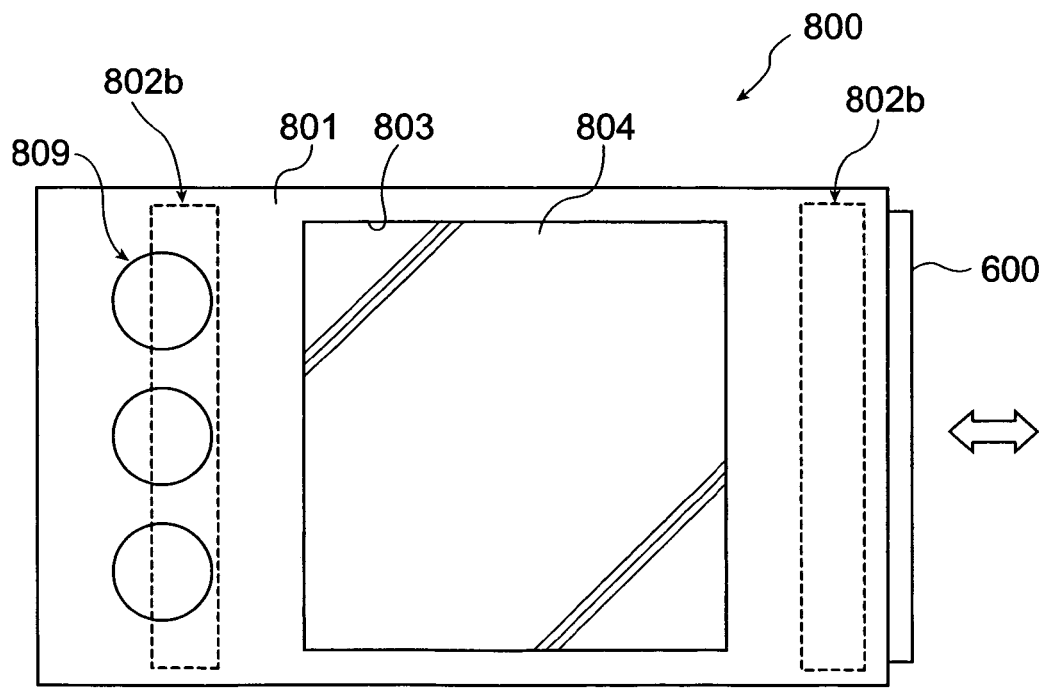

FIGS. 7A and 7B are diagrams showing an embodiment of applying the electronic equipment of the present invention to a display, where FIG. 7A is a cross-sectional view and FIG. 7B is a plan view.

A display 800 shown in the drawing is equipped with a main body 801 and the electronic paper 600 detachably provided in the main body 801. The electronic paper 600 has the above-described structure, that is, the same structure as that shown in FIG. 6.

The main body 801 is provided with an inlet 805 at a side thereof (right side in the figure) through which the electronic paper 600 can be inserted, and two pairs of feed rollers 802a and 802b inside thereof. When the electronic paper 600 is inserted into the main body 801 through the inlet 805, the electronic paper 600 is placed in the main body 801 while being interposed between the feed rollers 802a and 802b.

Also, on the display surface side (near side of FIG. 7B) of the main body 801, there is formed a rectangular hollow part 803 in which a transparent glass plate 804 is engaged. With such a structure, the electronic paper 600 placed in the main body 801 can be viewed from the outside of the main body 801. That is, the display 800 makes the electronic paper 600 placed in the main body 801 be viewed through the transparent glass substrate 804, thereby offering a display surface.

Furthermore, a terminal part 806 is provided on a tip of the electronic paper 600 at the end of the inserting direction (left side in the drawing), and a socket 807 to which the terminal part 806 is connected while the electronic paper 600 is placed in the main body 801, is provided inside the main body 801. A controller 808 and an operating unit 809 are electrically connected to the socket 807.

In such a display 800, the electronic paper 600 is detachably provided in the main body 801 and therefore can also be used with being detached from the main body 801 and being carried by a user.

Also, in such a display 800, the electronic paper 600 is composed of the above-described electrophoretic display 20.

Note that the application of the electronic equipment of the present invention is not limited to those described above. For example, examples of the application include a television, a video tape recorder of a view-finder type or a monitor viewing type, a car navigation system, a pager, a personal digital assistance, an electronic calculator, an electronic newspaper, a word processor, a personal computer, a workstation, a picture phone, a POS terminal, and a device equipped with a touch panel. The electrophoretic display 20 can be applied to a display of the above various electronic equipment.

Although the above descriptions have been made on a thin film transistor, a circuit board, a display and electronic equipment of the present invention, it should be understood that the present invention is not limited to the descriptions.

For example, although a thin film transistor of a top gate structure has been described in the above embodiment, the present invention can also be applied to thin film transistors of a bottom gate structure.

In addition, the structure of each part of the thin film transistor, circuit board, display and electronic equipment of the present invention can be replaced with any structure capable of exhibiting the same functions. Alternately, any structure can be added thereto.

WORKING EXAMPLES

Specific working examples of the present invention will now be described.

In the specific working examples, a thin film transistor was manufactured by using the above-described method of manufacturing a circuit board.

Therefore, methods of manufacturing thin film transistors and the evaluation of the manufactured thin film transistors will be described below.

1. Manufacturing of Thin Film Transistor

In the following examples, deionized water is used as water unless otherwise noted.

First Working Example

First a glass substrate with an average thickness of 1 mm was prepared and cleaned with water (cleaning fluid).

Next, the glass substrate was immersed in an aqueous solution (25° C.) of distearyl dimethyl ammonium chloride (cationic surfactant) for 60 seconds. Thus, distearyl dimethyl ammonium chloride was adsorbed to the surface of the glass substrate. Subsequently, the glass substrate was cleaned with water.

Then, the glass substrate was immersed in a Sn—Pd colloidal suspension (25° C.) for 60 seconds. Thus, Sn—Pd was adsorbed to the surface of the glass substrate. Subsequently, the glass substrate was cleaned with water.

Then, the glass substrate was immersed in an aqueous solution (25° C.) including $HBF_4$ and glucose for 60 seconds. Thus, Sn was removed from the surface of the glass substrate to expose Pd on the surface of the glass substrate. Subsequently, the glass substrate was cleaned with water.

Then, the glass substrate was immersed in a Ni plating solution (80° C., pH 8.5) for 60 seconds. Thus, a Ni plated film with an average thickness of 100 nm was formed on the surface of the glass substrate.

The Ni plating solution was prepared by dissolving 10 g of nickel sulfate, 100 g of hydrazine (reducing agent) and 5 g of ammonium sulfide (pH adjuster) in 1 L of water.

Next, a resist layer patterned correspondingly to the shapes of source and drain electrodes was formed on the Ni plated film by photolithography.

"OPR800" produced by Tokyo Ohka Kogyo Co., Ltd was used as the resist material.

Then, the glass substrate was immersed in an aqueous solution (25° C.) of ferric chloride. Thus, the plated film that was not covered by the resist layer was removed to form a source electrode and drain electrode.

The distance (channel length L) between source electrode fingers and drain electrode fingers was set to 10 μm, and the channel width W was set to 1 mm.

Then, after removing the resist layer by using a resist remover, the glass substrate having the source and drain electrodes formed thereon was cleaned with water and methanol sequentially.

Then, oxygen plasma treatment (atmospheric pressure oxygen plasma treatment) was carried out for the glass substrate having the source and drain electrodes formed thereon under the atmospheric pressure.

The conditions of the atmospheric pressure plasma treatment were as follows: RF power was 0.05 W/cm2 and gas flow rate was 80 sccm.

Next, a trimethylbenzene solution of 1.5% (wt/vol) polyphenylamine was applied on the glass substrate by an ink jet method (volume of one droplet was 20 pL), and then was dried at 60° C. for 10 minutes. Thus, an organic semiconductor layer with an average thickness of 50 nm was formed.

Subsequently, a butyl acetate solution of 6% (wt/vol) polystyrene was applied on the organic semiconductor layer by spin coating (2400 rpm) and then was dried at 60° C. for 10 minutes. Thus, the gate insulating layer with an average thickness of 400 nm was formed.

Then, a water dispersion liquid of Ag particles (viscosity of 6 cps at room temperature) was applied by an ink jet method (volume of one droplet was 20 pL) on part on the gate insulating layer that corresponded to the region in which the source electrode fingers and the drain electrode fingers interdigitated with each other, and thereafter was baked at 120° C. for 60 minutes. Thus, a gate electrode with an average thickness of 810 nm (porosity of 61%) was formed.

The thin film transistor shown in FIGS. 1A and 1B was manufactured through the above processes.

Second Through Fifth Working Examples

The thin film transistors shown in FIGS. 1A and 1B were manufactured in the same way as the first working example except that baking condition for a water dispersion liquid of Ag particles supplied on the gate insulating layer and the average thickness of the formed gate electrode were varied as shown in Table 1.

Sixth Working Example

Source and drain electrodes were formed in the same way as the first working example except that a polyimide substrate with an average thickness of 35 μm was used instead of a glass substrate. Thereafter, a toluene solution of 1% (wt/vol) fluorene-bithiophene copolymer was applied on the polyimide substrate by an ink jet method (volume of one droplet was 20 pL) and then was dried at 60° C. for 10 minutes. Thus, an organic semiconductor layer with an average thickness of 50 nm was formed.

Subsequently, a gate insulating layer and a gate electrode were formed in the same way as the above first working example, manufacturing the thin film transistors shown in FIGS. 1A and 1B.

Seventh through Tenth Working Examples

The thin film transistors shown in FIGS. 1A and 1B were manufactured in the same way as the sixth working example except that baking condition for a water dispersion liquid of Ag particles supplied on the gate insulating layer and the average thickness of the formed gate electrode were varied as shown in Table 1.

Comparative Example 1

A source and drain electrodes, organic semiconductor layer and gate insulating layer were manufactured in the same way as the first working example. Then, a resist layer having a pattern that corresponds to a region in which a gate electrode is not formed was formed on the gate insulating layer by photolithography.

"OPR800" produced by Tokyo Ohka Kogyo Co., Ltd. was used as the resist material.

Subsequently, a Ag film (gate electrode) was formed by vacuum deposition (the pressure inside the chamber was 1×10−3 Torr, the heating temperature of the substrate was 100° C.) on part on the gate insulating layer that corresponded to a region in which the resist layer is not formed, that is, a region in which the source electrode fingers and the drain electrode fingers interdigitate with each other.

Then, after removing the resist layer by using a resist remover, the glass substrate having the gate electrode formed on the gate insulating layer was cleaned with water and methanol sequentially. Thus, the gate electrode with an average thickness of 800 nm was formed.

The thin film transistor shown in FIGS. 1A and 1B was manufactured through the above processes.

Second Working Example

Source and drain electrodes were formed in the same way as the first comparative example except that a polyimide substrate with an average thickness of 35 μm was used instead of a glass substrate. Thereafter, a toluene solution of 1% (wt/vol) fluorene-bithiophene copolymer was applied on the polyimide substrate by an ink jet method (volume of one droplet was 20 μL) and then was dried at 60° C. for 10 minutes. Thus, an organic semiconductor layer with an average thickness of 50 nm was formed.

Subsequently, a gate insulating layer and a gate electrode ware formed in the same way as the above first comparative example, manufacturing the thin film transistor shown in FIGS. 1A and 1B.

TABLE 1

| | substrate | organic semi-conductor layer | gate electrode (Ag) baking condition | gate electrode average thickness [nm] | gate electrode porosity [%] |
|---|---|---|---|---|---|
| working example 1 | glass substrate | polyphenyl-amine | 120° C. 60 min in the air | 810 | 61 |
| working example 2 | glass substrate | polyphenyl-amine | 130° C. 60 min in the air | 680 | 54 |
| working example 3 | glass substrate | polyphenyl-amine | 150° C. 60 min in the air | 610 | 47 |
| working example 4 | glass substrate | polyphenyl-amine | 170° C. 60 min in the air | 560 | 35 |
| working example 5 | glass substrate | polyphenyl-amine | 200° C. 60 min in the air | 490 | 22 |
| working example 6 | polyimide substrate | fluorene-bithiophene copolymer | 120° C. 30 min in the air | 800 | 60 |
| working example 7 | polyimide substrate | fluorene-bithiophene copolymer | 130° C. 30 min in the air | 690 | 51 |
| working example 8 | polyimide substrate | fluorene-bithiophene copolymer | 150° C. 30 min in the air | 600 | 45 |
| working example 9 | polyimide substrate | fluorene-bithiophene copolymer | 170° C. 30 min in the air | 570 | 33 |
| working example 10 | polyimide substrate | fluorene-bithiophene copolymer | 200° C. 30 min in the air | 500 | 26 |
| comparative example 1 | glass substrate | polyphenyl-amine | (vacuum deposition) | 800 | — |
| comparative example 2 | polyimide substrate | fluorene-bithiophene copolymer | (vacuum deposition) | 800 | — |

2. Evaluation

The thin film transistors manufactured in each working example and comparative example were subjected to (1) a low temperature and low humidity environment (20° C., 30% RH) for one hour, and then were subjected to (2) a high temperature and high humidity environment (80° C., 80% RH) for 30 minutes. Thereafter the thin film transistors were again subjected to (3) a low temperature and low humidity environment (20° C., 30% RH) for five hours.

With respect to the thin film transistors manufactured in each working example and comparative example that had been subjected to such environments, the off-state current was measured after each of the above three stages.

The term off-state current refers to a current flowing between a source and drain electrodes when a voltage is not applied to a gate electrode.

Therefore, an off-state current closer to zero indicates that the thin film transistor has better characteristics.

These off-state currents are shown in Table 2.

TABLE 2

| | off-state current [nA/μm] (supply voltage = 1.2 V) | | |
|---|---|---|---|
| | (1): 20° C., 30% RH for 1 hour | (2): 80° C., 80% RH for 30 minutes after (1) | (3): 20° C., 30% RH for 5 hours after (2) |
| working example 1 | $5 \times 10^{-2}$ | $4 \times 10^{2}$ | $7 \times 10^{-2}$ |
| working example 2 | $5 \times 10^{-2}$ | $4 \times 10^{2}$ | $8 \times 10^{-2}$ |
| working example 3 | $6 \times 10^{-2}$ | $2 \times 10^{2}$ | $9 \times 10^{-2}$ |
| working example 4 | $5 \times 10^{-2}$ | $3 \times 10^{2}$ | $9 \times 10^{-2}$ |
| working example 5 | $6 \times 10^{-2}$ | $2 \times 10^{3}$ | $1 \times 10^{-1}$ |
| working example 6 | $7 \times 10^{-2}$ | $6 \times 10^{2}$ | $9 \times 10^{-2}$ |
| working example 7 | $7 \times 10^{-2}$ | $5 \times 10^{2}$ | $9 \times 10^{-2}$ |
| working example 8 | $6 \times 10^{-2}$ | $5 \times 10^{2}$ | $2 \times 10^{-1}$ |
| working example 9 | $7 \times 10^{-2}$ | $5 \times 10^{2}$ | $2 \times 10^{-1}$ |
| working example 10 | $7 \times 10^{-2}$ | $4 \times 10^{2}$ | $3 \times 10^{-1}$ |
| comparative example 1 | $5 \times 10^{-2}$ | $2 \times 10^{1}$ | $1 \times 10^{2}$ |
| comparative example 2 | $7 \times 10^{-2}$ | $4 \times 10^{1}$ | $3 \times 10^{2}$ |

As shown in Table 2, all thin film transistors manufactured in the working examples and comparative examples had a small off-state current and excellent characteristics at the time when the thin film transistors had been subjected to (1) a low temperature and low humidity environment (20° C., 30% RH) for one hour.

Subsequently, in the thin film transistors of the working examples, an off-state current was increased and the characteristics deteriorated after the thin film transistors had been subjected to (2) a high temperature and high humidity environment (80° C., 80% RH) for 30 minutes. However, after the thin film transistors had been again subjected to (3) a low temperature and low humidity environment (20° C., 30% RH) for five hours, the off-state current almost reverted to the value that had been measured after (1). This result indicates that oxygen and water that has been trapped in the thin film transistors are smoothly discharged. This discharging may allow the characteristics of the thin film transistors to be recovered rapidly.

In contrast, in all thin film transistors manufactured in the comparative examples, after the thin film transistors had been subjected to (2) a high temperature and high humidity environment (80° C., 80% RH) for 30 minutes, the increase of an off-state current was smaller than that for the working examples. However, even after the thin film transistors had been again subjected to (3) a low temperature and low humidity environment (20° C., 30% RH) for five hours, the off-state current was not decreased (recovered) but had a tendency to be increased conversely. This indicates that oxygen and water accumulate in the thin film transistor.

Reference Numerals

1: thin film transistor,
2: substrate,
3: source electrode, 3a: electrode finger,
4: drain electrode,
4a: electrode finger, 41: pixel electrode,
5: organic semiconductor layer, 51: channel region,
6: gate insulating layer,
7: gate electrode,
8: connection terminal, 81: first terminal, 82: second terminal,
9: line, 91: first line, 92: second line,
10: circuit board, 11: plated film, 12: resist layer, 12': resist material, 13: plating solution,
20: electrophoretic display,
25: electrophoretic display part, 251: facing substrate, 252: counter electrode,
30: protective film,
40: microcapsule, 400: electrophoretic dispersion liquid, 401, 402: electrophoretic particle,
45: binder,
600: electronic paper, 601: main body, 602: display unit,
800: display, 801 main body, 802a, 802b: pair of feed roller, 803: hollow part, 804: transparent glass plate, 805: inlet, 806: terminal part, 807: socket, 808: controller, 809: operating unit

We claim:

1. A transistor comprising:
   a source electrode and a drain electrode, both of the source electrode and the drain electrode being formed in a comb teeth shape, the teeth of the source electrode and the drain electrode being interdigitated with each other;
   an organic semiconductor layer provided in contact with the source electrode and the drain electrode;
   a gate insulating layer provided in contact with the organic semiconductor layer; and
   a gate electrode insulated from the source electrode and the drain electrode by intermediary of the gate insulating layer,
   the gate electrode being a porous film including an electrically conductive material.

2. The transistor according to claim 1, the transistor having a top gate structure.

3. The transistor according to claim 1, porosity of the porous film being from 20% to 85%.

4. The transistor according to claim 1, the porous film having a carbon atom or a carbon compound in a pore of the porous film.

5. The transistor according to claim 1, the conductive material including a plurality of metal particles.

6. The transistor according to claim 1, the organic semiconductor layer including arylamine or a derivative of arylamine.

7. The transistor according to claim 1, the organic semiconductor layer being including a copolymer, the copolymer including fluorine and bithiophene, or a derivative of the copolymer.

8. A circuit board having a transistor according to claim 1.

9. A display having the circuit board according to claim 8.

10. Electronic equipment having the display according to claim 9.

11. The transistor according to claim 1, the source electrode having a plurality of source electrode fingers, the drain electrode having a plurality of drain electrode fingers, a plurality of channel regions being formed between the plurality of source electrode fingers and the plurality of drain electrode fingers, the gate electrode covering the plurality of channel regions.

12. A transistor comprising:
- a source electrode and a drain electrode, both of the source electrode and the drain electrode being formed in a comb teeth shape, the teeth of the source electrode and the drain electrode being interdigitated with each other;
- an organic semiconductor layer provided in contact with the source electrode and the drain electrode;
- a gate insulating layer provided in contact with the organic semiconductor layer; and
- a gate electrode insulated from the source electrode and the drain electrode by intermediary of the gate insulating layer, at least one of the source electrode and the drain electrode being a porous film including an electrically conductive material.

13. A transistor comprising:
- a source electrode and a drain electrode, both of the source electrode and the drain electrode being formed in a comb teeth shape, the teeth of the source electrode and the drain electrode being interdigitated with each other;
- an organic semiconductor layer provided in contact with the source electrode and the drain electrode;
- a gate insulating layer provided in contact with the organic semiconductor layer; and
- a gate electrode insulated from the source electrode and the drain electrode by intermediary of the gate insulating layer, the gate electrode being a porous film including a plurality of metal particles.

* * * * *